United States Patent
Inoue et al.

(10) Patent No.: US 7,071,786 B2
(45) Date of Patent: Jul. 4, 2006

(54) CASCODE CIRCUIT AND INTEGRATED CIRCUIT HAVING IT

(75) Inventors: Akira Inoue, Tokyo (JP); Seiki Goto, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 50 days.

(21) Appl. No.: 10/873,291

(22) Filed: Jun. 23, 2004

(65) Prior Publication Data
US 2005/0007200 A1   Jan. 13, 2005

(30) Foreign Application Priority Data
Jul. 9, 2003   (JP) .............. 2003-272406

(51) Int. Cl.
*H03F 3/04* (2006.01)

(52) U.S. Cl. ...................... 330/311; 330/310
(58) Field of Classification Search ............... 330/311, 330/310, 302, 98, 150
See application file for complete search history.

(56) References Cited

U.S. PATENT DOCUMENTS 5,155,449 A * 10/1992 Ito .............................. 330/277
5,774,792 A    6/1998 Tanaka et al.
5,939,945 A *  8/1999 Thewes et al. ............. 330/277
6,137,367 A   10/2000 Ezzedine et al.
6,515,547 B1 * 2/2003 Sowlati ...................... 330/311

FOREIGN PATENT DOCUMENTS

JP    6-224647    8/1994
JP    3169775     3/2001

OTHER PUBLICATIONS

Bruce M. Green, et al., "Cascode Connected AlGaN/GaN Hemt's on SiC Substrates", IEEE Microwave and Guided Wave Letters, vol. 10, No. 8, Aug. 2000, pp. 316-318.

* cited by examiner

*Primary Examiner*—Henry Choe
(74) *Attorney, Agent, or Firm*—Oblon, Spivak, McClelland, Maier & Neustadt, P.C.

(57) ABSTRACT

A cascode circuit includes a first field effect transistor which has a source terminal grounded, a second field effect transistor which has a source terminal connected to a drain terminal of the first field effect transistor, and a first capacitor connected between the source terminal of the first field effect transistor and a gate terminal of the second field effect transistor. The first field effect transistor and the second field effect transistor are cascode-connected successively. A capacitance value of the first capacitor is 0.01 to 10 times that between the gate and source terminals of the second field effect transistor.

36 Claims, 13 Drawing Sheets

CASCODE CIRCUIT AND INTEGRATED CIRCUIT HAVING IT

BACKGROUND OF THE INVENTION

1. Field of the Invention

The present invention relates to a cascode circuit used in a high frequency circuit, and an integrated circuit having the cascode circuit.

2. Description of the Related Art

Cascode circuit, which includes field-effect transistors (hereinafter, referred to as "FETs") cascode-connected successively (hereinafter, referred to as "cascode FET"), is used in a high frequency amplifier circuit of such as a cellular phone. The cascode circuit includes a first FET, a second FET and a capacitor. A source terminal of the first FET is grounded, a drain terminal of the first FET is connected to a source terminal of the second FET. A gate terminal of the first FET, the source terminal of the first FET, and a drain terminal of the second FET function as a gate terminal, a source terminal, and a drain terminal of the cascode circuit, respectively. A gate terminal of the second FET is grounded through a capacitor. As to this, refer to "Cascode Connected AlGaN/GaN HEMT's on SiC Substrates" by Bruce M. Green, IEEE Microwave and Guided Wave Letters, vol 10, No. 8, p 316 to 318, August 2000 (hereinafter, referred to as "document 1"), and Japanese Laid-open Patent Publication No. 6-224647 (hereinafter, referred to as "document 2"), for example. The gate terminal of the first FET is connected to a gate voltage setting terminal. By using the gate voltage setting terminal, a direct current voltage is applied to the gate terminal of the first FET. A voltage of 0 V is normally applied to the gate voltage setting terminal, but a desired voltage may be applied thereto in some cases.

A drain terminal of the second FET is connected to a high voltage power supply. If the second FET is used alone, it is necessary to DC-DC convert the power supply voltage to reduce it, and supply the reduced voltage to the drain terminal of the second FET, because a withstand voltage of the single FET is generally as low as 10 to 30 V. However, if the cascode FET in which two FETs are connected successively is used, it becomes unnecessary to reduce the power supply voltage, because the withstand voltage between the drain and source terminals of the cascode FET becomes two times between the drain and source terminals of a single FET. As a result, in the case where the cascode FET is used, it is possible to reduce conversion loss caused by above-mentioned DC-DC conversion, so that the efficiency of the whole system including the cascode FET can be enhanced.

However, in the cascode circuit as disclosed in documents 1 and 2, a capacitance value of the capacitor is set large, so that the gate terminal of the second FET is short-circuited with respect to high frequency. Therefore, there is a problem that a voltage between the drain and source terminals of the first FET is maintained constant, so that the cascode circuit can not output a voltage proportional to the operation voltage thereof. Further, in such a cascode circuit, there is also a problem that only the voltage between the drain and source terminals of the second FET is varied within a narrow width (voltage amplitude), so that the output voltage of the cascode circuit is low. As a result, even if the operation voltage of the cascode circuit is increased, the amplitude of the voltage between the drain and source terminals of the cascode circuit is low, so that the output power of the cascode circuit is low and the efficiency thereof is low.

On the other hand, the Japanese Patent No.3169775 discloses an integrated circuit having a FET for use in a high frequency circuit.

SUMMARY OF THE INVENTION

It is an object of the present invention to provide a cascode circuit which outputs high power and operates with high efficiency, and an integrated circuit having the cascode circuit.

The cascode circuit of the present invention includes a first field effect transistor which has a source terminal grounded, a second field effect transistor which has a source terminal connected to a drain terminal of the first field effect transistor, and a first capacitor connected between the source terminal of the first field effect transistor and a gate terminal of the second field effect transistor. The first field effect transistor and the second field effect transistor are cascode-connected successively. Aa capacitance value of the first capacitor is 0.01 to 10 times that between the gate and source terminals of the second field effect transistor.

An advantage of the cascode circuit according to the present invention is that it can output high power and operate with high efficiency.

BRIEF DESCRIPTION OF THE DRAWINGS

Additional objects and advantages of the present invention will be apparent from the following detailed description of preferred embodiments thereof, which are best understood with reference to the accompanying drawings.

DETAILED DESCRIPTION OF THE PREFERRED EMBODIMENTS

The following is a detailed description of main embodiments of the invention, with reference to the drawings in which the same numerical references designate the corresponding elements throughout the different drawings.

1st Embodiment

Figure 1:
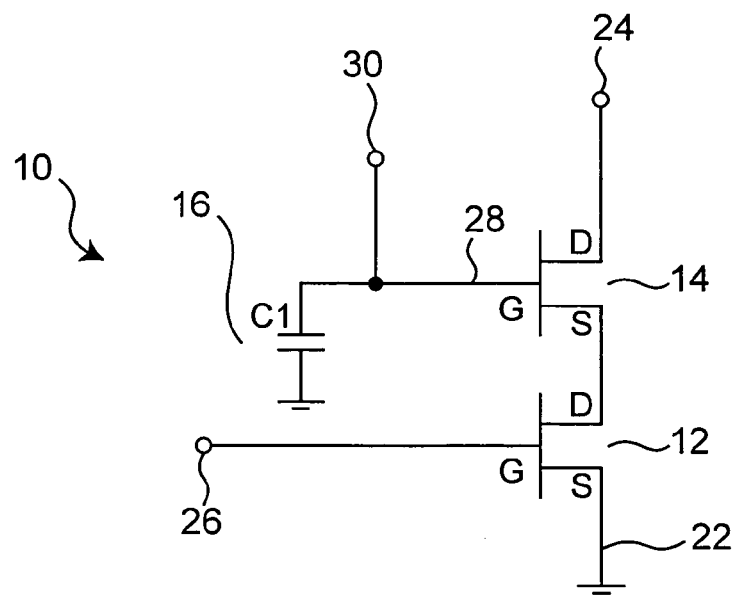
FIG. 1 is a circuit diagram of a cascode circuit according to a first embodiment of the present invention.

FIG. 1 shows a cascode circuit according to a first embodiment of the present invention. As shown in FIG. 1, the cascode circuit 10 includes two junction FETs which are cascode-connected successively. The cascode circuit 10 includes a first N-type junction FET 12, a second N-type junction FET 14, and a capacitor 16. Hereinafter, the junction FET is simply referred to as "FET". The first FET 12 and the second FET 14 have the same characteristics. A source terminal (S) 22 of the first FET 12 is grounded, and a drain terminal (D) thereof is connected to a source terminal (S) of the second FET 14. A drain terminal (D) 24 of the second FET 14 is connected to an alternating current power supply (an average of the power supply voltage: Vdd). A gate terminal (G) 26 of the first FET 12, the source terminal (S) 22 of the first FET 12, and the drain terminal (D) 24 of the second FET 14 act as a gate terminal, a source terminal, and a drain terminal of the cascode circuit 10, respectively. One end of the capacitor 16 is connected to a gate terminal 28 of the second FET 14, and the other end thereof is connected to the source terminal 22 of the first FET 12 (that is, the other end thereof is "grounded"). The gate terminal 28 of the second FET 14 is connected to a gate voltage setting terminal 30. By using the gate voltage setting terminal 30, a direct voltage is applied to the gate terminal 28 of the second FET 14. A voltage of 0V is normally applied to the gate voltage setting terminal 30, but a desired voltage is applied thereto in some cases.

Figure 2:
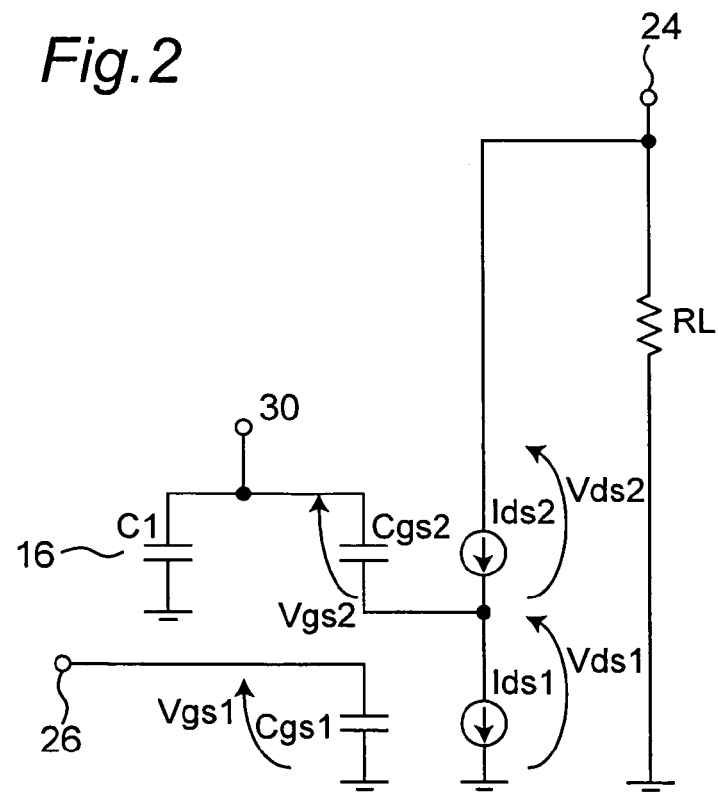
FIG. 2 is a diagram of an equivalent circuit of the cascode circuit shown in FIG. 1.

FIG. 2 shows an equivalent circuit of the cascode circuit shown in FIG. 1. In FIG. 2, a value of a voltage between the drain and source terminals of the first FET 12 is indicated as Vds1, and that of a voltage between the drain and source terminals of the second FET 14 is indicated as Vds2, a value of drain current of the first FET 12 is indicated as Ids1, and that of drain current of the second FET 14 is indicated as Ids2. Further, a value of capacitance between the gate and source of the first FET 12 is indicated as Cgs1, and that of capacitance between the gate and source of the second FET 14 is indicated as Cgs2. Further, a value of a voltage between the gate and source terminals of the first FET 12 is indicated as Vgs1, and that of a voltage between the gate and source terminals of the second FET 14 is indicated as Vgs2.

Figure 3A:
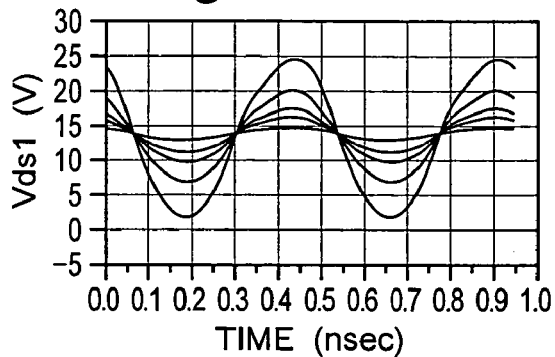
FIG. 3A is a wave form chart of a voltage between the drain and source terminals of a first FET of the cascode circuit shown in FIG. 1 in the case where the capacitance value is 0 pF.
Figure 3B:
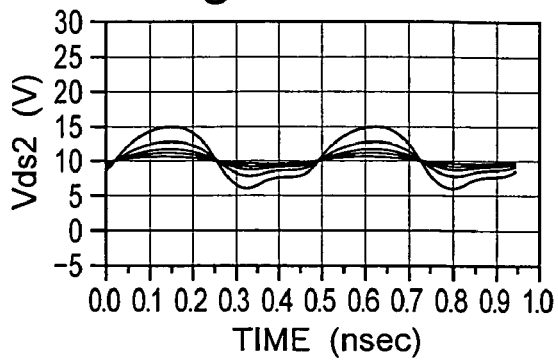
FIG. 3B is a wave form chart of a voltage between the drain and source terminals of a second FET of the cascode circuit shown in FIG. 1 in the case where the capacitance value is 0 pF.

A capacitance value C1 of the capacitor 16 will be explained below. FIGS. 3A–3E show wave form charts of a voltage (voltage value: Vds1) between the drain and source terminals of the first FET 12, and that of a voltage (voltage value: Vds2) between the drain and source terminals of the second FET 14, in cases where operation simulations are carried out with the capacitance values C1 being 0 pF, 0.6 pF, and 20 pF. When C1=0 pF, as shown in FIG. 3B, the amplitude of voltage Vds2 is small. When C1=20 pF, as shown in FIG. 3E, the amplitude of Vds1 is small. When the capacitance value C1 is set to 0.6 pF (C1=0.6 pF), where the capacitor 16 is not short circuited with respect to radio frequency (RF), both the voltages Vds1 and Vds2 are varied within a range of about ±10V, and output voltage of the cascode circuit 10 is varied within a range of ±20V. As above-described and as shown in FIG. 3, the output voltage of the cascode circuit 10 can be increased and the efficiency thereof can be enhanced by optimizing the capacitance value C1. Some curves in each waveform arise from the variation in a voltage input to the cascode circuit 10 (that is, a voltage applied to the gate terminal 26).

Next, the optimal value of the capacitance value C1 is obtained by using the equivalent circuit shown in FIG. 2. With reference to FIG. 2, Eq. (1) is hold.

$$C1(\delta Vds1+\delta Vds2)+Cgs2\delta Vgs2=0. \quad (1)$$

Figure 3C:
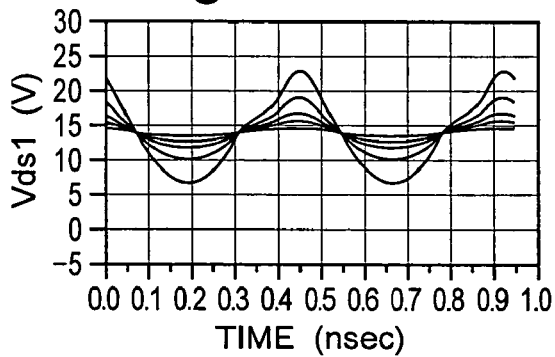
FIG. 3C is a wave form chart of a voltage between the drain and source terminals of the first FET of the cascode circuit shown in FIG. 1 in the case where the capacitance value is 0.6 pF.
Figure 3D:
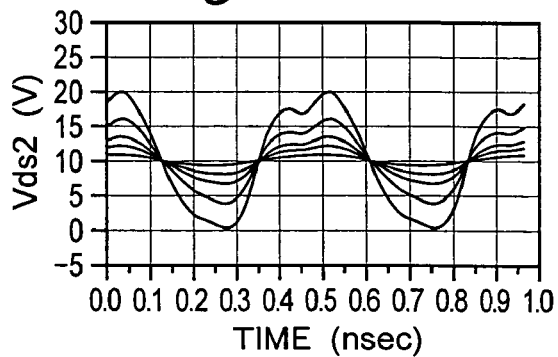
FIG. 3D is a wave form chart of a voltage between the drain and source terminals of the second FET of the cascode circuit shown in FIG. 1 in the case where the capacitance value is 0.6 pF.
Figure 3E:
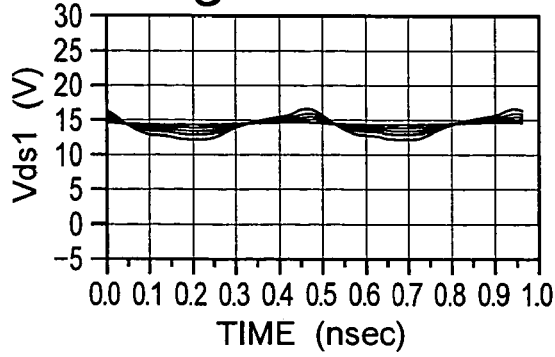
FIG. 3E is a wave form chart of a voltage between the drain and source terminals of the first FET of the cascode circuit shown in FIG. 1 in the case where the capacitance value is 20 pF.
Figure 3F:
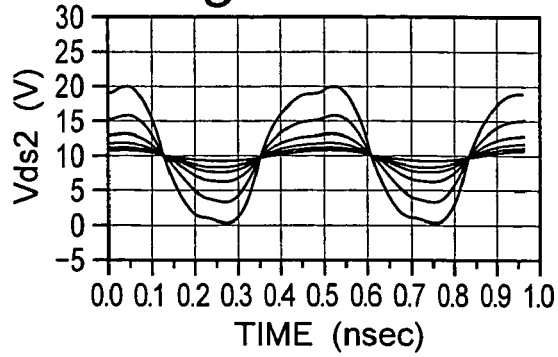
FIG. 3F is a wave form chart of a voltage between the drain and source terminals of the second FET of the cascode circuit shown in FIG. 1 in the case where the capacitance value is 20 pF

When the two FETs are operated equally, as shown in FIGS. 3C and 3D, the cascode circuit outputs a maximum power. In this case, Eqs. (2) to (4) are hold.

$$\delta Vgs1=\delta Vgs2, \quad (2)$$

$$\delta Vds1=\delta Vds2, \quad (3)$$

$$\frac{(\delta Vds1 + \delta Vds2)}{RL} = -g_m \delta Vgs1, \quad (4)$$

where gm indicates a value of mutual conductance and RL indicates a value of load resistance.

Further, Eq. (5) can be derived from Eqs. (1) to (4).

$$C1 = \frac{Cgs2}{g_m RL/2 - 1}. \quad (5)$$

With reference to Eq. (5), when a general condition of the cascode circuit used in the high frequency circuit, that is, gm=48 mS, Cgs2=3 pF, and RL/2=89 Ω are hold, the capacitance value C1 becomes 0.9 pF. This capacitance value substantially corresponds to the C1=0.6 pF, when both Vds1 and Vds2 are varied within a range of about ±10 V in the above mentioned simulation. Thus, at this time, the output voltage of the cascode circuit 10 is increased and the efficiency thereof is enhanced.

Generally, the cascode circuit 10 is used in the high frequency circuit, and the value of 1/{gmRL/2−1} is set to any in the range of about 0.01 to 10 due to a type of FET and a matching condition. Thus, in order to obtain a cascode circuit which outputs high power and operates with high efficiency, the capacitance value C1 should be in a range of 0.01 to 10 times the capacitance value Cgs2.

As described above, the cascode circuit of this embodiment can output high power and operate with high efficiency by optimizing the capacitance value C1.

In the cascode circuit of this embodiment, in which two FETs are cascode-connected successively, a withstand voltage between the source and drain terminals of the cascode FET is about two times that between the source and drain terminals of a single FET. Thus, it is unnecessary to DC-DC convert the power supply voltage to reduce it, so that a conversion loss caused by the DC-DC conversion can be reduced. Further, the cascode circuit of this embodiment can operate at high voltage and output a high power, even if it includes an FET with a low withstand voltage.

Further, in the cascode circuit of this embodiment, a metal oxide semiconductor FET (MOSFET) may be used, instead of the junction FET, as a semiconductor device to be cascode-connected. Also in that case, the cascode circuit can output high power and operate with high efficiency by optimizing the capacitance value of the capacitor. Further, a bipolar transistor can be used, instead of the junction FET. Also in that case, the cascode circuit can output high power and operate with high efficiency by optimizing various conditions.

2nd Embodiment

Figure 4:
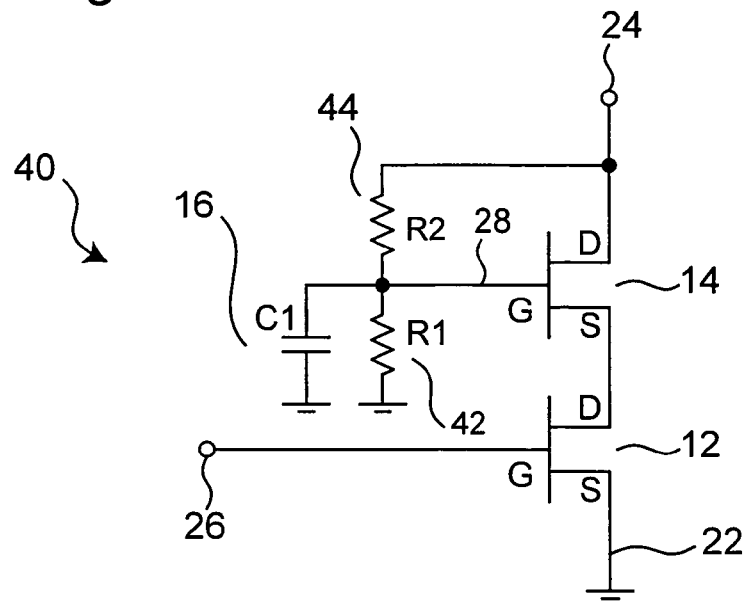
FIG. 4 is a circuit diagram of a cascode circuit according to a second embodiment of the present invention.

FIG. 4 shows a cascode circuit according to a second embodiment of this invention. A cascode circuit 40 shown in FIG. 4 is different from the cascode circuit 10 shown in FIG. 1 in that the gate voltage setting terminal 30 is eliminated, and a first resistor 42 and a second resistor 44 are added. One end of the first resistor 42 is connected to the gate terminal 28 of the second FET 14, and the other end thereof is connected to the source terminal of the first FET 12 (that is, the other end thereof is "grounded"). The second resistor 44 is connected between the gate terminal 28 and the drain terminal 24 of the second FET 14.

In the cascode circuit 40 shown in FIG. 4, a voltage to be applied to the gate terminal 28 is determined by using the first resistor 42 and the second resistor 44, which divide a voltage between the drain terminal 24 of the second FET 14 and the ground. Thus, unlike the case in which the voltage is applied to the gate terminal 28 by using a gate setting terminal 30, there is a merit that, even if Vdd=0V, forward current does not flow through the gate terminal 28, so that it is possible to prevent the second FET 14 from being destroyed.

Figure 5:
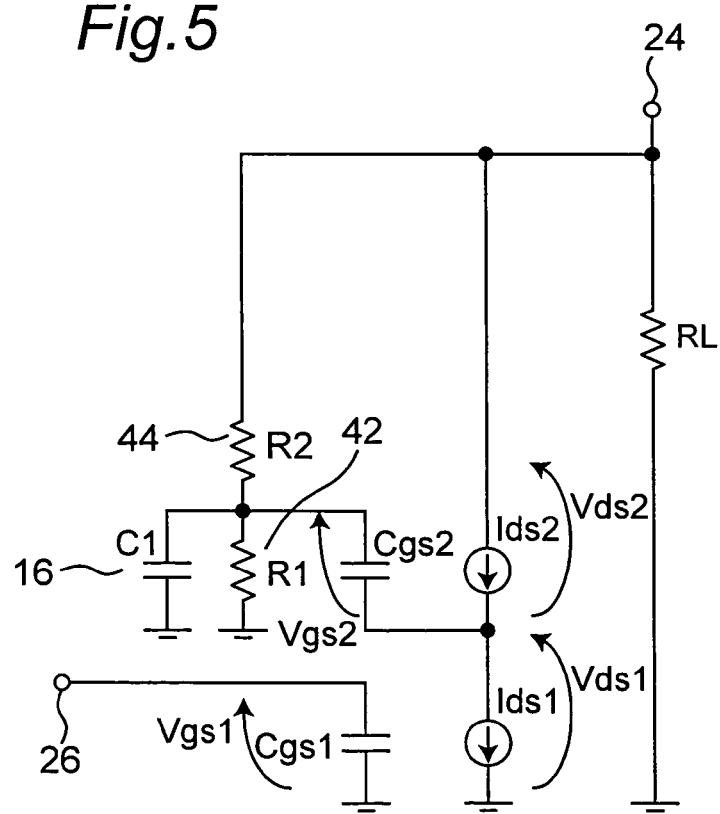
FIG. 5 is a diagram of equivalent circuit of the cascode circuit shown in FIG. 4.

FIG. 5 shows an equivalent circuit of the cascode circuit shown in FIG. 4. In FIG. 5, a value of a voltage between the drain and source terminals of the first FET 12 is indicated as Vds1, and that of a voltage between the drain and source terminals of the second FET 14 is indicated as Vds2. Further, a value of drain current of the first FET 12 and that of drain current of the second FET 14 are indicated as Ids1 and Ids2, respectively. A value of capacitance between the gate and source terminals of the first FET 12 is indicated as Cgs1, and that of capacitance between the gate and source terminals of the second FET 14 is indicated as Cgs2. Further, a value of a voltage between the gate and source terminals of the first FET 12 is indicated as Vgs1, and that of a voltage between the gate and source terminals of the second FET 14 is indicated as Vgs2.

The capacitance value C1 of the capacitor 16 is set in a range of 0.01 to 10 times the capacitance value Cgs2, as explained in the first embodiment.

Unlike the cascode circuit 10 of the first embodiment, the cascode circuit 40 of this embodiment includes resistors 42 and 44. Thus, the output voltage of the cascode circuit 40 is also affected by resistance values of the resistors 42 and 44. The condition will be described in the following, which is met by a value (R1) of the first resistor 42 and a value (R2) of the second resistor 44 such that the cascode circuit 40 outputs high power. The cascode circuit 40 outputs high power, when the amplitude of voltage between the drain and source terminals of the cascode circuit 40 is high. When the amplitude of voltage between the drain and source terminals of the cascode circuit 40 is high, an amplitude of a voltage between the drain and source terminals of FET 12 and that of a voltage between the drain and source terminals of FET 14 are both high. Thus, it is preferable that the resistance values (R1, R2) are set such that the amplitude of the voltage between the drain and source terminals of each of the FETs 12 and 14 is maximum, that is, such that a voltage Vds1 between the drain and source terminals of FET 12 is equal to a voltage Vds2 between the drain and source terminals of FET 14. In this case, the voltage between the drain and source terminals of each of FETs 12 and 14 is Vdd/2, since an average of the alternating current power supply voltage is Vdd. In reference to FIG. 5, Eq. (6) is hold.

$$Vgs2 + \frac{Vdd}{2} = Vdd \times \frac{R1}{R1+R2}. \quad (6)$$

Further, Eq. (7) is derived from Eq. (6).

$$\frac{R1}{R2} = \frac{\left(1 + \frac{2Vgs2}{Vdd}\right)}{\left(1 - \frac{2Vgs2}{Vdd}\right)} \quad (7)$$

When Eq. (7) is hold, the voltage between the drain and source terminals of each of FETs 12 and 14 is equal to Vdd/2, and the output power of the cascode circuit 40 is maximum. For example, when Vgs1(=Vgs2)=−2.1 V and Vdd=24 V are hold, R1/R2=0.7 is hold. In this example, when Vgs1=−2.1 V, drain current (drain current value: Ids1) of the first FET 12 is 1/10 or less of drain saturation current (drain saturation current value: Idss).

RF current flowing through the first resistor 42 must be sufficiently lower than RF current flowing through capacitance (capacitance value: Cgs2) between the gate and source terminals of the second FET 14, because Eq. (1) is hold only when R1, R2>>1/ω(Cgs2 is hold. Here, if a resistance value of the first resistor 42 per unit gate width of the second FET 14 is defined as R1o, Eq. (8) needs to be hold with respect to R1o.

$$Rl_0 >> \left| \frac{1}{\omega \times \frac{Cgs2}{Wg}} \right|, \quad (8)$$

where Wg indicates a gate width of the second FET 14, Cgs2/Wg indicates a capacitance value between the gate and source terminals of the second FET 14 per unit gate width thereof (1 mm). For example, when f=2.1 GHz ($\omega$=2$\pi$f), Cgs2=3 pF and Wg=1.6 mm, R1o>>40 $\Omega$/mm is hold. When R1o>>0.4 k$\Omega$/mm is hold, which is obtained by giving a margin of one or more digit to the resistance value R1o, RF current flowing through the first resistor 42 becomes sufficiently lower than that flowing through the capacitance between the gate and source terminals of the second FET 14.

Gate leakage current of the second FET 14 flows through the first resistor 42. For example, when the voltage (the voltage value: Vdg) between the drain and gate terminals of the second FET 14 is 12 V (that is, Vdg=12), the gate leakage current of about 10 $\mu$A flows per unit gate width of the second FET 14. In this case, it is necessary that the resistance value R1o per unit gate width of the second FET 14 meets the equation of R1o×Ig<<12, where Ig indicates the gate leakage current value, such that the gate voltage of the second FET 14 is not varied with the gate leakage current flowing through the first resistor 42. That is, it is necessary that the equation of R1o<<1200 k$\Omega$/mm is hold. When R1o<<1200 k$\omega$/mm is hold, which is obtained by giving a margin of one or more digit to the resistance value R1o, the affect of the gate leakage current flowing through the first resistor 42 can be ignored.

As described above, if the resistance value (R1o) per unit gate width (1 mm) of the second FET 14 is more than 0.4 k$\Omega$and less than 120 k$\Omega$, the high frequency performance of the cascode circuit 40 is not deteriorated, and the affect of the gate leakage current can be ignored. Further, the conditions of f=2.1 GHz and Cgs=3 pF are typical in high frequency band of 800 MHz or higher in which the cascode circuit is used. Thus, the condition of 0.4 k$\Omega$<<R1o<<120 k$\Omega$ is can be applied to the cascode circuits other than the cascode circuit according to this embodiment. That is, this condition can also be applied to a general cascode circuit having the same configuration as the cascode circuit of this embodiment. Further, if at least the condition of 0.1 k$\Omega$<<R1o<<120 k$\Omega$ is satisfied, there is an advantage that the high frequency performance of the cascode circuit 40 is not deteriorated, and the affect of the gate leakage current can be ignored.

As described above, the cascode circuit of this embodiment can output high power and operate with high efficiency by optimizing the values of C1, R1 and R2.

According to the cascode circuit of this embodiment, even if Vdd=0, forward current does not flow through the gate terminal of the second FET, so that the second FET is not destroyed, and safety of the cascode circuit is improved.

Further, the withstand voltage between the source and drain terminals of the cascode circuit according to this embodiment becomes two times that between the source and drain terminals of a single FET, because two FET are cascode-connected successively in the case of cascade circuit. Thus, it is unnecessary to convert the power supply voltage to reduce it, so that it is possible to reduce the conversion loss caused by the voltage conversion. Further, the cascode circuit of this embodiment can operate at high voltage and output high power, even if it includes an FET having a low withstand voltage.

Further, in the cascode circuit of this embodiment, MOSFET can be used, instead of the junction FET, as a semiconductor device to be cascode-connected. Also in that case, the cascode circuit can output high power and operate with high efficiency by optimizing the capacitance value of the capacitor and the resistance values of the resistors. Further, a bipolar transistor can be used, instead of the junction FET. Also in that case, the cascode circuit can output high power and operate with high efficiency by optimizing various conditions.

Figure 6:
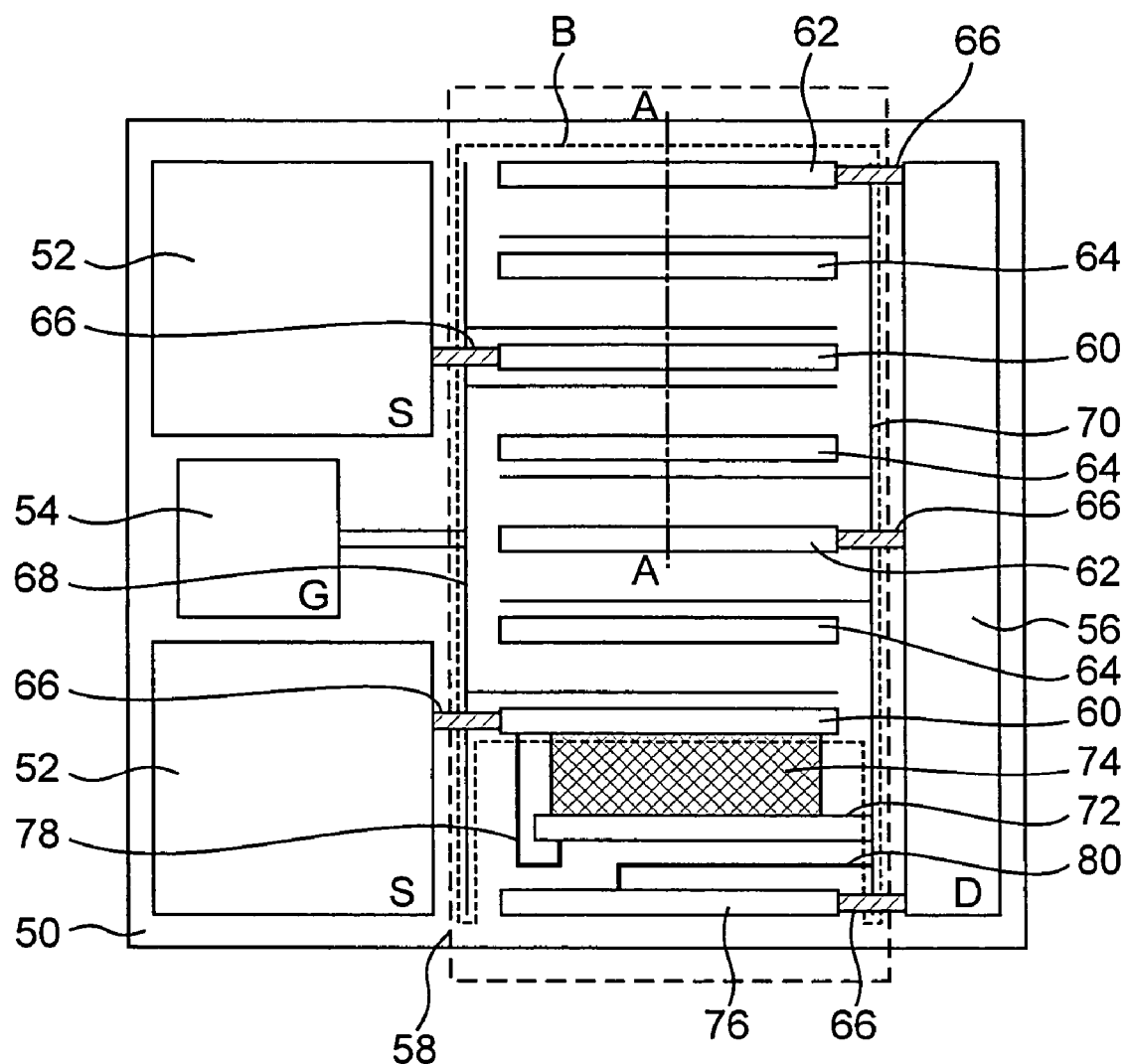
FIG. 6 is a diagram of an electrode pattern of the integrated circuit having the cascode circuit shown in FIG. 4.

Next, an integrated circuit of the cascode circuit 40 will be explained. FIG. 6 is a top view of the integrated circuit having the cascode circuit according to this embodiment. FIG. 6 shows an electrode pattern in which three cascode circuits (that is, three cascode FETs) are connected to one another in parallel on a substrate 50. The electrode pattern includes two source electrode regions 52, a gate electrode region 54, a drain electrode region 56, and a cascode connecting region 58. As shown in FIG. 6, the two source electrode regions 52 and the gate electrode region 54 are disposed on a left end of the surface of the substrate 50, the drain electrode region 56 is disposed on the right end thereof, and the cascode connecting region 58 is disposed on a central portion thereof between the source and gate electrode regions 52 and 54, and the drain electrode region 56.

In the cascode connecting region 58, the three cascode circuit, each of which includes cascode FET, a capacitor, and two resistors as shown in FIG. 4, are arranged. The cascode connecting region 58 will be described in detail. First, each of the source electrodes 60 of the cascode FETs, corresponding to the source terminals of the cascode FETs, and each of the drain electrodes 62 of the cascode FETs, corresponding to the drain terminal thereof, are alternately arranged in the cascode connecting region 58. The direction in which each of the source electrodes 60 of the cascode FETs and each of the drain electrodes 62 of the cascode FETs are alternately arranged (hereinafter, referred to as "arrangement direction") is perpendicular to a direction in which each of the source electrode regions 52 (and gate electrode region 54) and the drain electrode region 56 are opposed to each other. The source electrodes 60 and the drain electrodes 62 are rectangular, and their arrangement direction is perpendicular to a longer side of the rectangular shape. A floating electrode 64 is provided between each of the source electrodes 60 and each of the drain electrodes 62, as a connector to connect the first FET and the second FET of the cascode FET. Each of the source electrodes 60 and each of the drain electrodes 62 are connected to the left side source electrode region 52 and the right side drain electrode region 56, respectively, through air bridges 66. Hereinafter, a set of one source electrode 60 and one drain electrode 62, between which one floating electrode 64 is provided, is referred to as a FET cell.

Further, in the cascode connecting region 58, a gate electrode 68 for three first FETs of three cascode FETs (hereinafter, referred to as "a first gate electrode 68") and a gate electrode 70 for three second FETs of three cascode FETs (hereinafter, referred to as "a second gate electrode 70") are arranged. The first and second gate electrodes 68 and 70 are both of comb-like shape, and are common to the three cascode FETs. More specifically, as shown in FIG. 6, the first gate electrode 68 includes a straight portion extending between the source electrode region 52 (and gate electrode region 54) and a plurality of FET cells, and a plurality of branched portions extending from the straight portion, each of which exists between each of the source electrodes 60 and each of the floating electrodes 64, which are adjacent to each other. And, the second gate electrode 70 includes a straight portion extending between the drain electrode region 56 and the plurality of FET cells, and a plurality of branched portions extending from the straight portion, each of which exists between each of the drain electrodes 62 and each of the floating electrodes 64, which are adjacent to each other. The first gate electrode 68 is connected to the gate electrode region 54 on the left end of the substrate 50. Hereinafter, a region surrounded by dotted line B, which includes the plurality of the FET cells, the first gate electrode 68 and the second gate electrode 70, is referred to as a FET region.

Further, in the cascode connecting region 58, an electrode 72 is disposed adjacent to the FET region. The electrode 72 is connected to the second gate electrode 70, so that an electric potential of the electrode 72 is equal to that of the second gate electrode 70. An MIM (Metal/Insulator/Metal) capacitor 74 (also referred to as "capacitor region") is disposed between the electrode 72 and one of the source electrodes 60 closest to the electrode 72, as the capacitor 16 shown in FIG. 4.

Further, in the cascode connecting region 58, an electrode 76 is disposed adjacent to the electrode 72. Like the drain electrodes 62 in the FET region, the electrode 76 is connected to the drain electrode region 56 through the air bridge 66, which crosses spatially the second gate electrode 70. Further, in the cascode connecting region 58, wire resistors 78 and 80 are disposed as the first and second resistors 42 and 44, respectively. As shown in FIG. 6, the first wire resistor 78, corresponding to the first resistor 42, is connected between the source electrode 60 and the electrode 72, which are both adjacent to the MIM capacitor 74. The second wire resistor 80, corresponding to the second resistor 44, is connected between the second gate electrode 70 and the electrode 76.

As shown in FIG. 6, the electrode pattern includes the single MIM capacitor 74 and the two wire resistors 78 and 80 for the three cascode FETs.

Here, the source electrode regions 52, the gate electrode region 54 and the drain electrode region 56 are connected to the outside of the integrated circuit by metal wires. At least of the source electrode regions 52 may be connected to a ground electrode on a back surface of the substrate 50 by a via hole formed below the source electrode region 52.

Figure 7:
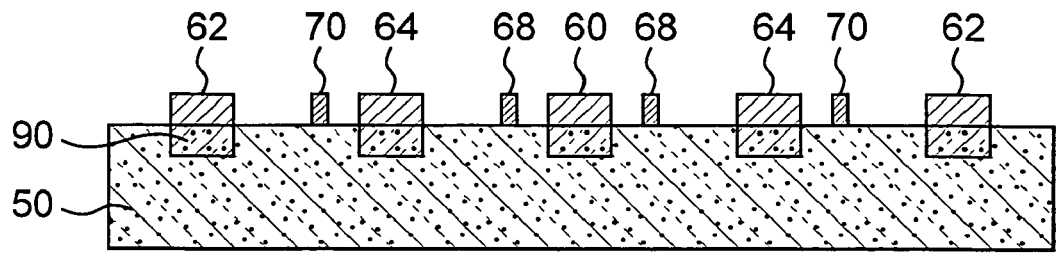
FIG. 7 is a sectional view taken along a chain line A—A in FIG. 6.

FIG. 7 is a sectional view taken along a chain line A—A in FIG. 6. As shown in FIG. 7, the source electrodes 60, the drain electrodes 62 and the floating electrodes 64 are provided on the substrate 50 in such a way that they form ohmic contacts with ion implantation regions 90 formed on the substrate 50. Each of the first gate electrodes 68 is provided between each of the source electrodes 60 and each of the floating electrodes 64, while each of the second gate electrodes 70 is provided between each of the drain electrodes 62 and each of the floating electrodes 64. Here, each of the first and second gate electrodes 68 and 70 is disposed closer to the source electrode 60 than the drain electrode 62, which has a higher potential than the source electrode 60. That is, the first gate electrode 68 is disposed closer to the source electrode 60 than the floating electrode 64, and the second gate electrode 70 is disposed closer to the floating electrode 64, which is closer to the source electrode 60 than the drain electrode 62, than the drain electrode 62. According to the above-mentioned configuration, the withstand voltage of each FET can be increased. In addition, the semiconductor substrate 50 has high resistance, so that each of the floating electrodes 64 and the electrodes surrounding it are sufficiently insulated from each other. Thus, the electric potential of the floating electrode 64 is held at about Vdd/2, so that the semiconductor device (that is, FET) can be prevented from being destroyed, even if the first and second FETs are turned off at the same time.

In the electrode pattern shown in FIG. 6, the wire resistors 78 and 80, corresponding to the resistors of the cascode circuit, and the capacitor 74, corresponding to the capacitor thereof, are disposed in the vicinity of the FET region. In the conventional integrated circuit having a cascode circuit, the capacitor and the resistors generally have been provided on a different substrate than the FETs is provided on. In the case of the integrated circuit of this embodiment, the capacitor 74 and the wire resistors 78 and 80 are provided on the same substrate as the FETs, and are disposed in the vicinity of the FET region, so that the distance between each of the FETs and the capacitor 74, and the distance between each of the FETs and each of the wire resistors 78 and 80 are shortened compared to the conventional integrated circuit. Thus, lengths of wires to connect the components to one another can be reduced, so that parasitic inductance caused by long lengths of the wires can be ignored. As a result, the cascode circuit can be operated at sufficiently high frequency.

The capacitor 74 is connected between the electrode 72, disposed adjacent to the FET region, and the source electrode 60 of the FET region. Thus, the distance between the capacitor 74 and each of the FETs is shortened compared to the conventional integrated circuit. Thus, the parasitic inductance caused by a long distance between the capacitor 74 and each of the FETs can be reduced. As a result, the capacitance value C1 of the capacitor 16 can easily be set in a range of 0.01 to 10 times Cgs2, while ignoring the parasitic inductance.

According to the above-mentioned electrode pattern, the integrated circuit can incorporate the capacitor and the resistor without deteriorating the RF characteristics.

Figure 8:
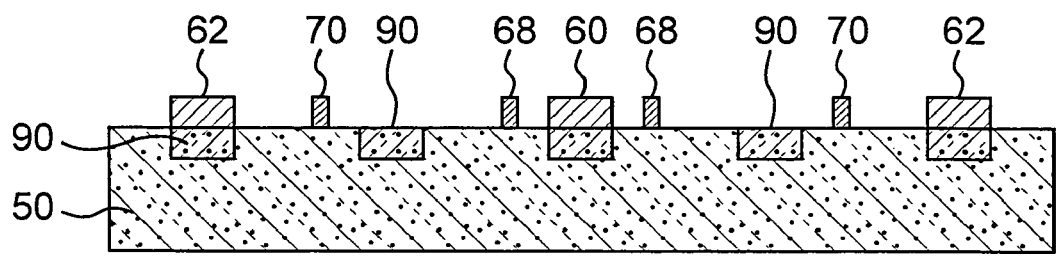
FIG. 8 is a diagram of another cross section of the integrated circuit shown in FIG. 6.

In the integrated circuit of the embodiment, the floating electrodes 64 are provided on the substrate 50, but they may be omitted as shown in the sectional view of FIG. 8. Even if the floating electrodes 64 are omitted and only the ohmic regions 90 are used, the cascode circuit operates in the same manner as in the case where the floating electrodes 64 exist. If the floating electrodes 64 are omitted, the ohmic regions can be reduced in size, so that the chip size of the integrate circuit and the cost thereof can be reduced.

Figure 9:
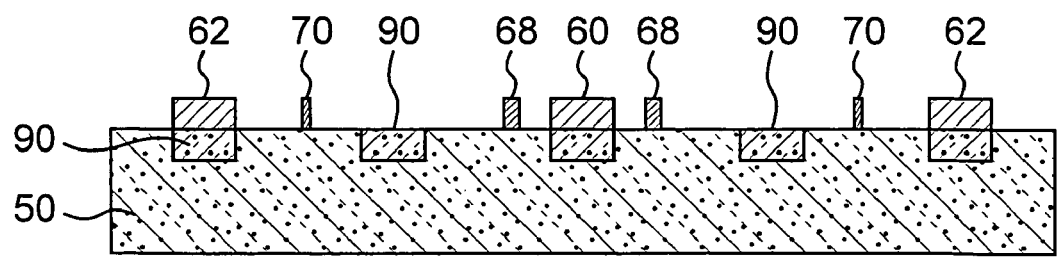
FIG. 9 is a diagram of further cross section of the integrated circuit shown in FIG. 6.

In the integrated circuit of this embodiment, the gate length of each first FET is equal to that of each second FET. That is, as shown in FIG. 7, a length of each of the first gate electrodes 68 is equal to that of each of the second gate electrodes 70 in the arrangement direction of the source and drain electrodes 60 and 62. However, the gate length of each second FET may be set shorter than that of each first FET. FIG. 9 shows that the length of each of the second gate electrodes 70 is shorter than that of each of the first gate electrodes 68. According to this configuration, a gain of each second FET becomes high, so that the entire gain of each cascode FET becomes high. Further, even if the gate lengths of each first FET and each second FET are varied due to manufacturing variation, the variation in the gate length of each first FET on the input side is shorter than that in the gate length of each second FET, so that the variation in input matching becomes smaller.

Figure 10:
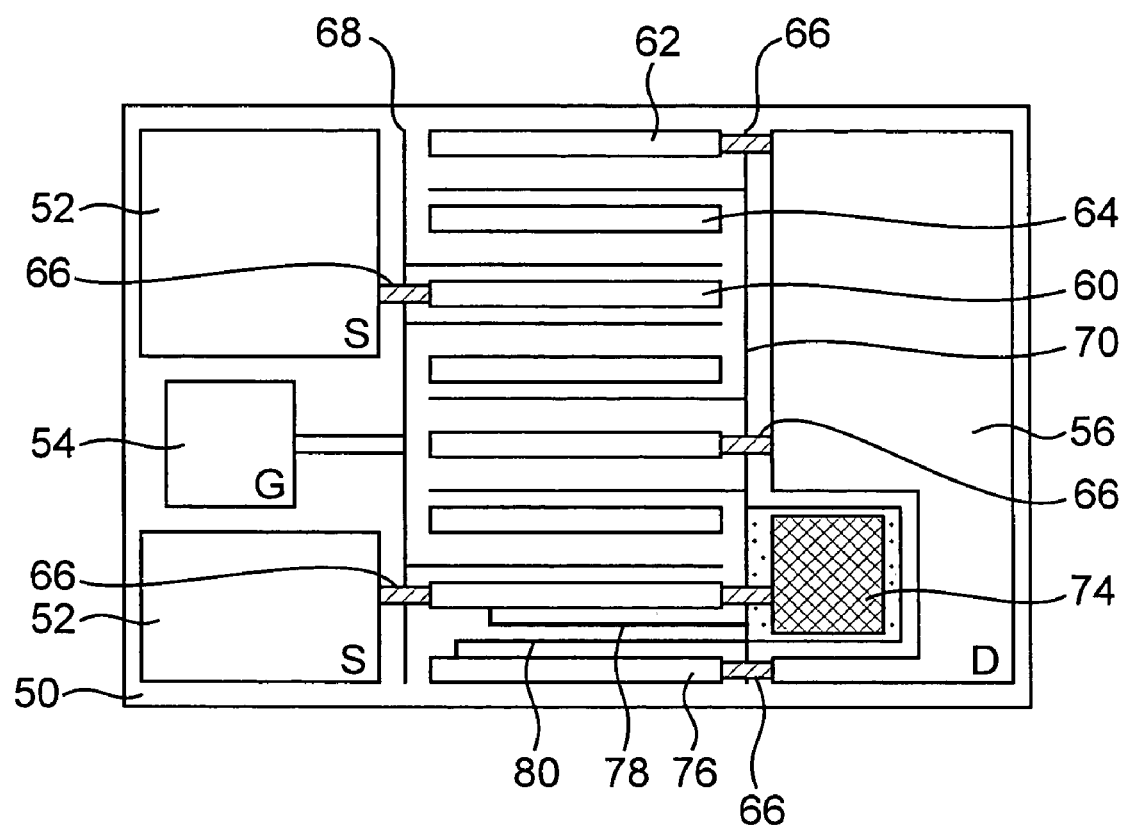
FIG. 10 is a diagram of another electrode pattern of the integrated circuit having the cascode circuit shown in FIG. 4.

The electrode pattern shown in FIG. 6 is just a example, and the cascode circuit of this embodiment can also be realized by using the other electrode patterns. FIG. 10 shows another electrode pattern in which three cascode circuits are connected in parallel on the substrate 50. In the electrode pattern shown in FIG. 10, an MIM capacitor 74 is provided on the right end on the surface of the substrate 50 in such a manner that a part of the drain electrode region 56 shown in FIG. 6 is replaced by the MIM capacitor 74. More specifically, one of source electrodes 60 of FET region is disposed between the MIM capacitor 74 and one of the source electrode regions 52. A direction in the MIM capacitor 74 and the source electrode region 52 are opposed to each other is perpendicular to an arrangement direction of the source electrodes 60 and the drain electrodes 62. The upper metal of the MIM capacitor 74 is connected to the source electrode region 52 by way of one of source electrodes 60. The electrode 72 shown in FIG. 6, which is connected to the second gate electrode 70, is eliminated, and a lower metal of the MIM capacitor 74 and the first wire resistor 78 are directly connected to the straight portion of the second gate electrode 70. According to this configuration, the area of the cascode connecting region 58 can be reduced, so that the integrated circuit can be smaller in size and more inexpensive. Further, according to this configuration, even if the size of the integrated circuit is kept same, more cascode FETs can be connected in parallel on the cascode connecting region 58, so that it is possible to obtain an integrated circuit which outputs higher power.

Figure 11:
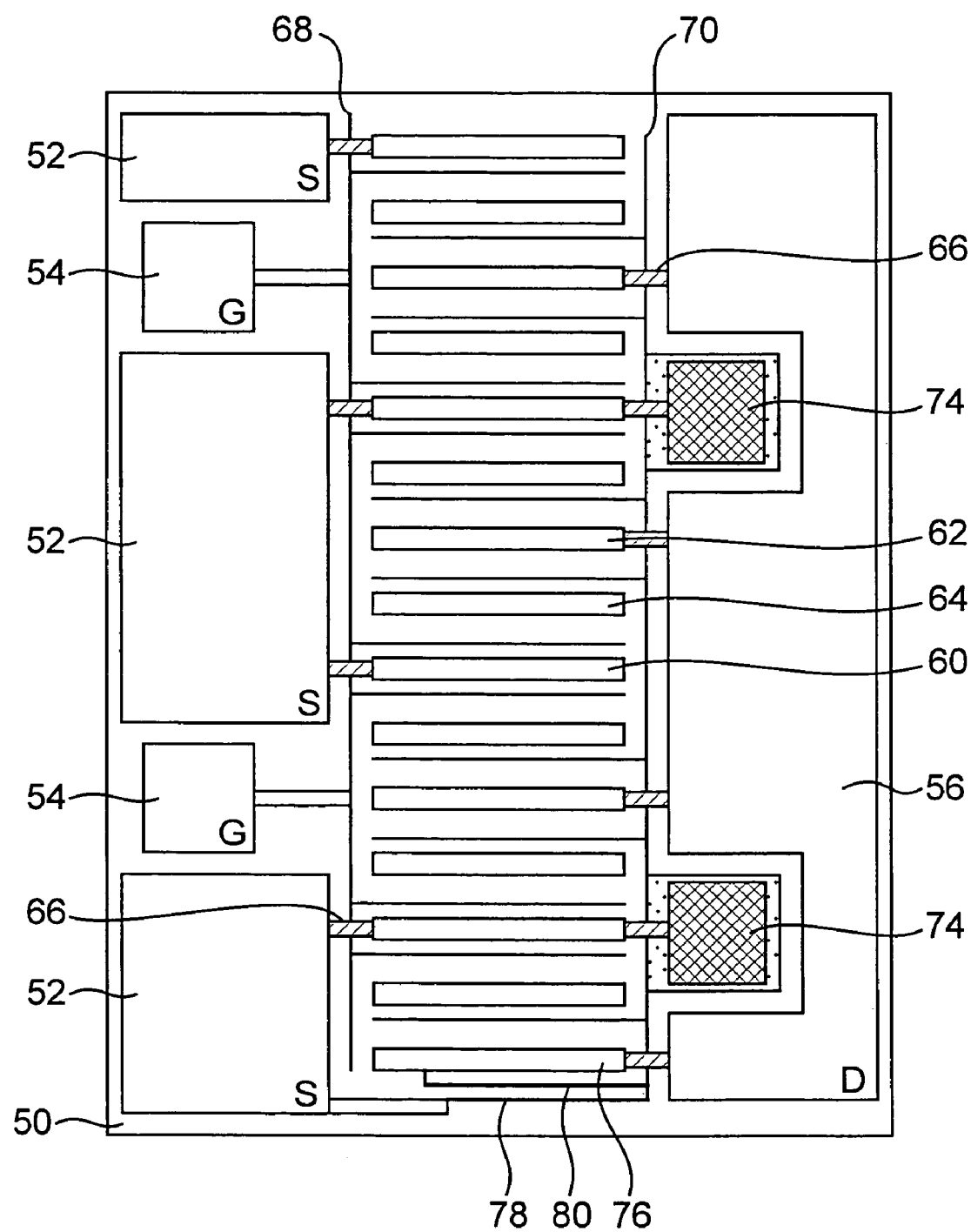
FIG. 11 is a diagram of further electrode pattern of the integrated circuit having the cascode circuit shown in FIG. 4.
Figure 12:
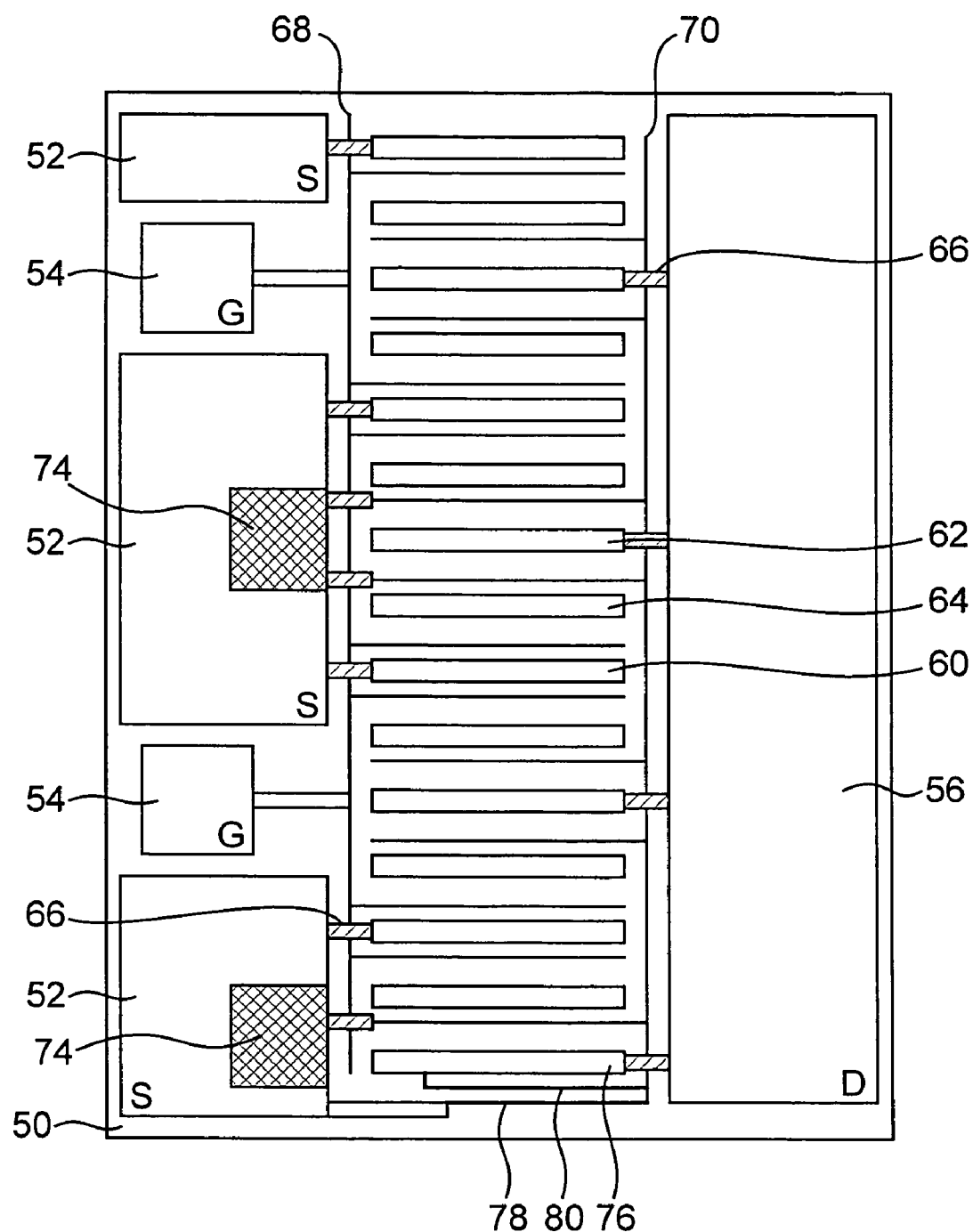
FIG. 12 is a diagram of still further electrode pattern of the integrated circuit having the cascode circuit shown in FIG. 4.

FIG. 11 shows further example of the electrode pattern. In this electrode pattern, seven cascode FETs are connected in parallel on the substrate 50. Each of the source electrodes 60 of the cascode FETs and each of the drain electrodes 62 thereof are alternately arranged between the source electrode regions 52 (and gate electrode regions 54) and the drain electrode region 56. Their arrangement direction is perpendicular to a direction in which each of the source electrode regions 52 (and gate electrode regions 54) and the drain electrode region 56 are opposed to each other. Further, in this electrode pattern, a plurality of MIM capacitors 74 (also referred to as "partial capacitor regions") are provided on the substrate 50. Each of the plurality of MIM capacitors 74 is disposed on the substrate 50 in such a manner that one of the source electrodes 60 is disposed between each MIM capacitor 74 and one of the source electrode regions 52. That is, the arrangement direction of the source and drain electrodes 60 and 62 is perpendicular to a direction in which one of the source electrode regions 52 and each MIM capacitor 74 are opposed to each other. While, in the electrode pattern shown in FIG. 6, a single MIM capacitor 74 is disposed between one of the source electrode regions 52 and the drain electrode region 56. According to the configuration shown in FIG. 11, even if many cascode FETs are connected in parallel, the distances between each FET and one of the MIM capacitors 74 become short, so that the parasitic inductance caused by the long distance between each FET and the MIM capacitor 74 can be reduced. As a result, the electrode pattern shown in FIG. 11 can be used at sufficiently high frequency. Further, each MIM capacitors 74 in the integrated circuit shown in FIG. 11 can be smaller in size than the single MIM capacitor 74 shown in FIG. 10. Thus, even if the area of the substrate 50 is small, the plurality of MIM capacitors 74 can be disposed on the substrate 50, and a small and inexpensive integrated circuit can be realized. FIG. 12 shows an electrode pattern in which a plurality of MIM capacitors 74 are provided in such a manner that they are opposed to the drain electrode region 56. In this case, some source electrode regions 52 serve as the lower metals of the MIM capacitors 74, and the upper metals of the MIM capacitors 74 are connected to the branched portions of the second gate electrode 70 through the air bridges 66. Also in that case, the same effect as in the case as shown in FIG. 11 can be obtained. Further, the source electrode region 52 serves as the lower metal of the capacitor 74, so that the number of steps of the production process can be reduced and the production cost can be reduced.

In the integrated circuit of this embodiment, a MIM capacitor is used as the capacitor 16. However, the other capacitor such as a gap capacitor and a junction capacitor may be used. Further, as the first and second resistors 42 and 44, resistors other than the wire resistors, for example, implantation resistors may be used. The number of cascode circuits connected in parallel, that is, the number of FET cells, may be any.

Figure 13A:
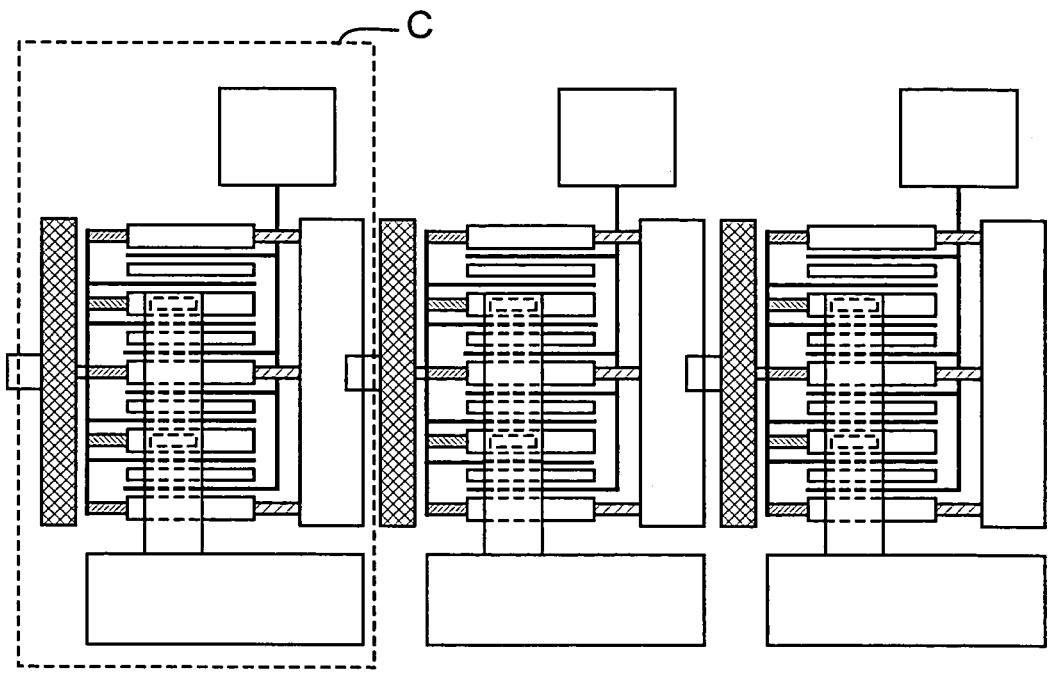
FIG. 13A is a top view of the substrate on which a plurality of cell assemblies are arranged.
Figure 13B:
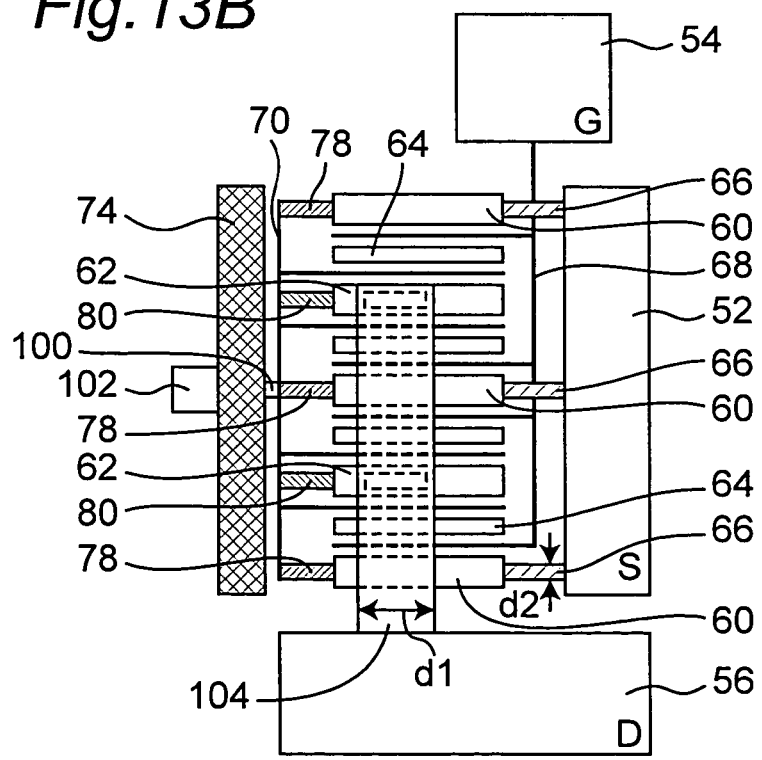
FIG. 13B is one of the plurality of cell assemblies shown in FIG. 13A.

FIGS. 13A and 13B show still further example of the electrode pattern. FIG. 13A is a top view of the substrate on which a plurality of cell assemblies are arranged. When the cell assemblies are arranged as shown in FIG. 13A, a plurality of cascode circuits are connected in parallel. FIG. 13B shows one of the cell assemblies shown in FIG. 13A, in detail. This cell assembly is indicated by a dotted line C in FIG. 13A. In the electrode pattern shown in FIG. 13B, each of the source electrodes 60 of the cascode FETs and each of the drain electrodes 62 thereof are alternately arranged between the source electrode region 52 and the MIM capacitor 74. Their arrangement direction is perpendicular to a direction in which the source electrode region 52 and the MIM capacitor 74 are opposed to each other. Further, each of the source electrodes 60 of the cascode FETs and each of the drain electrodes 62 thereof are alternately arranged between the gate electrode region 54 and the drain electrode region 56. Their arrangement direction is parallel to a direction in which the gate electrode region 54 and the drain electrode region 56 are opposed to each other. The source electrodes 60, the drain electrodes 62 and the floating electrodes 64, each of which is disposed each of the source electrodes 60 and each of the drain electrodes 62 are surrounded by the source electrode region 52, the gate electrode region 54, the drain electrode region 56 and the MIM capacitor 74. Each of the electrodes 60, 62 and 64 is rectangular, and a direction in which they are arranged is perpendicular to a longer side of the rectangular shape.

The first gate electrode 68 and the second gate electrode 70 are of comb-like shape. The first gate electrode 68 includes a straight portion extending along the source electrode region 52, and the second gate electrode 70 includes a straight portion extending along the MIM capacitor 74. The straight portion of the first gate electrode 68 is connected to the gate electrode region 54, while the straight portion of the second gate electrode 70 is connected to the MIM capacitor 74 through a gate electrode-capacitor connector 100. The gate electrode-capacitor 100 may be a lower metal of the MIM capacitor 74.

In addition, as shown in FIG. 13B, the cell assembly includes a capacitor-source connector 102, by which the upper metal of the MIM capacitor 74 and the source electrode region 52 of the adjacent cell are connected to each other.

Each of the source electrodes 60 of the FET region is connected to the source electrode region 52 through the air bridge 66, and each of the drain electrodes 62 thereof is connected to the drain electrode region 56 through an air bridge 104. One end of the air bridge 104 is connected to the drain electrode region 56. The air bridge 104 crosses spatially the FET region, that is, it crosses spatially the source electrodes 60, drain electrodes 62, and the first and second electrodes 68 and 70 with it electrically connected to the drain electrodes 62. A wire resistor 78, corresponding to the first resistor 42, is connected between each of source electrodes 60 and the straight portion of the second gate electrode 70, while a wire resistor 80, corresponding to the second resistor 44, is connected between each of the drain electrodes 62 and the straight portion of the second gate electrode 70. The source electrode region 52 is connected to the ground electrode on the back surface of the semiconductor substrate by a via hole.

As shown in FIGS. 13A and 13B, drain electrodes 62 of one cell assembly are connected to the drain electrode region 56 by means of the air bridge 104. According to the electrode pattern shown in FIGS. 13A and 13B, the width of the air bridge is not limited by a length of a shorter side of the rectangular drain electrode 62 but is limited by a length of a longer side thereof, while it is limited by a length of a shorter side of the rectangular drain electrode 62 in the previously described electrode patterns. Thus, the width d1 of the air bridge 104 can be wider than the width d2, corresponding to the width of the air bridge 66 in the previously described electrode patterns. That is, d1>d2 is hold. For example, when d2=10 μm is hold, d1=400 μm can be hold. By using such an air bridge with a wider width, a large amount of current can flow through each of the drain electrodes 62, so that the output power of the cascode circuit can be increased.

In the electrode pattern shown in FIGS. 13A and 13B, the wire resistors 78 and 80 corresponding to the resistors of the cascode circuit, and the MIM capacitor 74 corresponding to the capacitor thereof are disposed adjacent to the FET region. Thus, the distance between each of the FETs in the FET region and each of the wire resistors 78 and 80, and the distance between each of the FETs and the capacitor 74 become short. Thus, lengths of wires to connect the components to one another can be reduced, so that parasitic inductance caused by long lengths of the wires can be ignored. As a result, the cascode circuit can be operated at sufficiently high frequency.

Further, in the electrode pattern as shown in FIGS. 13A and 13B, the direction in which the source electrode region 52 and the MIM capacitor 74 are opposed to each other is perpendicular to the direction in which the gate electrode region 54 and the drain electrode region 56 are opposed to each other. Therefore, the pattern size can be reduced, so that the production cost of the integrated circuit can be reduced.

In FIGS. 13A and 13B, the wire resistors 78 and the wire resistor 80 are connected to each of the source electrodes 60 and each of the drain electrodes 62, respectively, in a cell assembly. However, if high resistance is required, the wire resistors may be connected to the source electrode region 52 and the drain electrode region 56 in an adjacent cell assembly to increase the lengths of the wires.

The floating electrodes 64 may be omitted. Each of the branched portions of the first gate electrode 68 and each of the branched portions of the second gate electrode 70 may be provided closer to the source electrode 60 than the drain electrode 62, between which they are disposed. Further, the gate length of the second FET may be shorter than that of the first FET. In such cases, the same effect as described above can be obtained.

In order to obtain an integrated circuit having the cascode circuit according to the first embodiment, the wire resistors 78 and 80, the electrode 76, and the air bridge 66, which connects the electrode 76 and the drain electrode region to each other, can be eliminated in each of the configurations shown in FIGS. 6, and 10–12. Further, in order to obtain the integrated circuit having the cascode circuit according to the first embodiment, the wire resistors 78 and 80 can be eliminated in the configuration shown in FIG. 13.

3rd Embodiment

Figure 14:
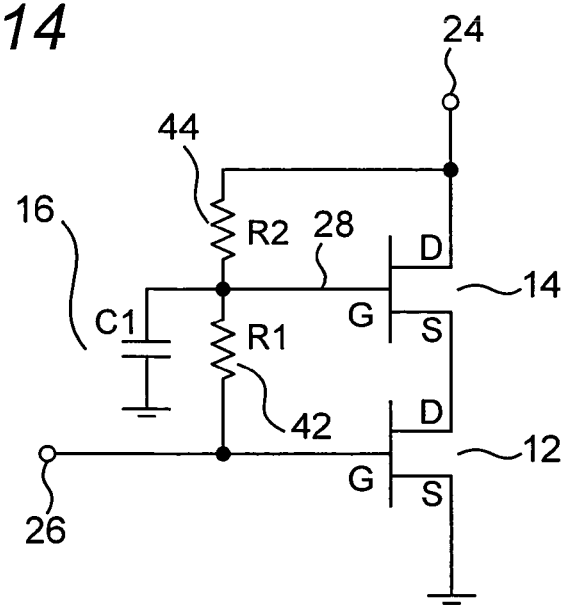
FIG. 14 is a circuit diagram of a cascode circuit according to a third embodiment of the present invention.

FIG. 14 is a circuit diagram of a cascode circuit according to a third embodiment of this invention. The cascode circuit of the third embodiment is different from that of the second embodiment in that the one end of the first resistor 42 is not grounded but is connected to the gate terminal 26 of the first FET 12.

Figure 15:
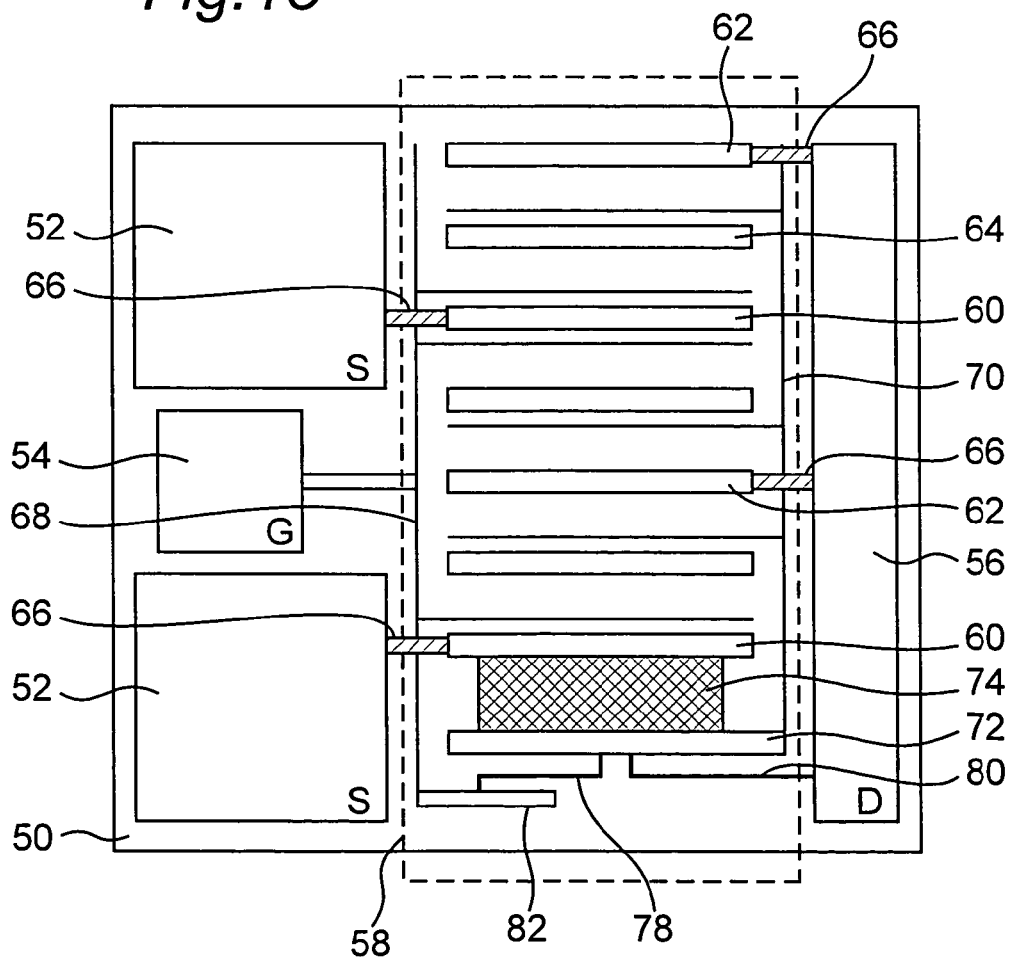
FIG. 15 is an electrode pattern of an integrated circuit having the cascode circuit shown in FIG. 14.

FIG. 15 is a top view of the integrated circuit having the cascode circuit of this embodiment. FIG. 15 shows an electrode pattern in which three cascode circuits are connected in parallel on the substrate 50. The electrode pattern shown in FIG. 15 is different from that shown in FIG. 6 in that an electrode 82 connected to the first gate electrode 68 is disposed adjacent to the electrode 72, instead of the electrode 76, that the first wire resistor 78, corresponding to the first resistor 42, is connected between the electrode 72 and the electrode 82, and that the second wire resistor 80, corresponding to the second resistor 44, is connected between the electrode 72 and the drain electrode region 56.

In the cascode circuit 40 shown in FIG. 14, a voltage applied to the gate terminal 28 is determined by using the first and second resistances 42 and 44, which divide a voltage between the drain terminal 24 of the second FET 14 and the gate terminal 26. Thus, unlike the case in which the voltage is applied to the gate terminal 28 by using a gate setting terminal 30, there is a merit that, even if Vdd=0V, forward current does not flow through the gate terminal 28, so that it is possible to prevent the second FET 14 from being destroyed.

The cascode circuit of this embodiment can output high power and operate with high efficiency by optimizing C1, R1 and R2.

In the cascode circuit of this embodiment, the resistance values R1 and R2 are set such that the amplitude of the voltage between the drain and source terminals of each of the FETs 12 and 14 is maximum, that is, such that a voltage Vds1 between the drain and source terminals of FET 12 is equal to a voltage Vds2 between the drain and source terminals of FET 14.

Also in the cascode circuit of this embodiment, like the cascode circuit 40 of the embodiment 2, it is necessary that the resistance value R1o of the first resistor 42 per unit gate width (1 mm) of the second FET 14 is higher than 0.1 kΩ and lower than 120 kΩ. At this time, the high frequency performance of the cascode circuit is not deteriorated and the affect of the gate leakage current can be ignored.

According to the cascode circuit of this embodiment, the same effect as in the case of the second embodiment can be obtained In the electrode pattern shown in FIG. 15, the wire resistors 78 and 80 and the MIM capacitor 74 are disposed adjacent to the FET region. In the conventional integrated circuit having a cascode circuit, the capacitor and the resistors generally have been provided on a different substrate than the FETs is provided on. In the case of the integrated circuit of this embodiment, the capacitor 74 and the wire resistors 78 and 80 are provided on the same substrate as the FETs, and are disposed in the vicinity of the FET region, so that the distance between each of the FETs and the capacitor 74, and the distance between each of the FETs and each of the wire resistors 78 and 80 are shortened compared to the conventional integrated circuit. Thus, lengths of wires to connect the components to one another can be reduced, so that parasitic inductance caused by long lengths of the wires can be ignored. As a result, the cascode circuit can be operated at sufficiently high frequency.

The electrode pattern shown in FIG. 15 is just an example, and the cascode circuit of this embodiment can also be realized by using the other electrode patterns. For example, as shown in FIGS. 10 and 11, each of one or more MIM capacitors 74 may provided opposed to one of source electrode regions 52. Alternatively, as shown in FIG. 12, the MIM capacitor 74 may be provided opposed to the drain electrode region 56. Further, as shown in FIG. 13, each of the drain electrodes 62 and the drain electrode region 56 may be connected to each other by using a wide air bridge. The MIM capacitors 74 of each of the cell assemblies may be connected to the source electrode region of the adjacent cell assembly. In any cases, the same effect as described in the second embodiment can be obtained.

The integrated circuit of this embodiment may have any cross sections shown in FIGS. 7 to 9. In each case, the same effect as the corresponding case as described in the second the embodiment can be obtained.

4th Embodiment

Figure 16:
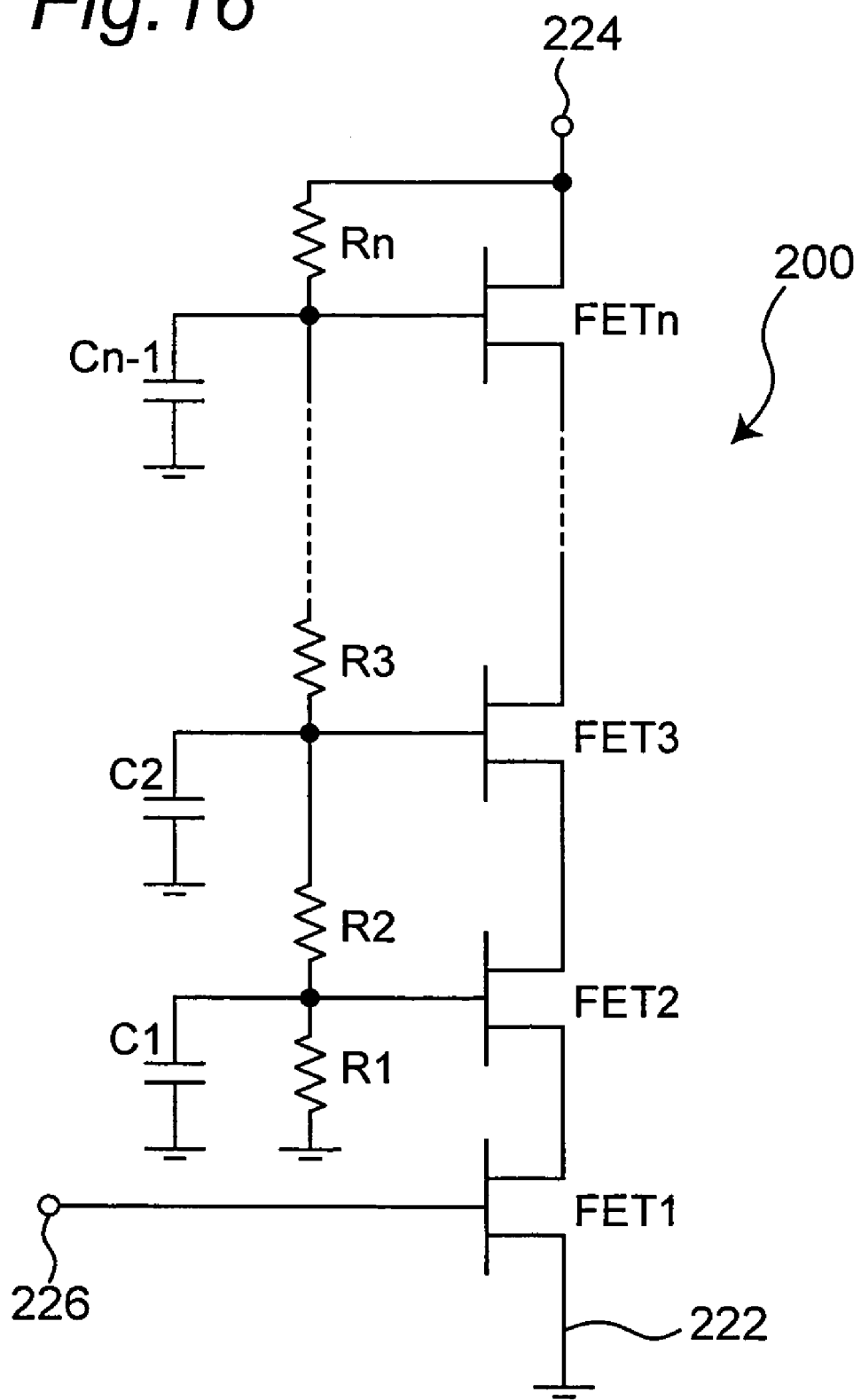
FIG. 16 is a circuit diagram of a cascode circuit according to a fourth embodiment of the present invention.

FIG. 16 is a diagram of a cascode circuit according to a fourth embodiment of the present invention. As shown in FIG. 16, the cascode circuit 200 of this embodiment includes n junction FETs cascode-connected successively, where n is a positive integer equal to and larger than three. The cascode circuit 200 includes the n N-type FETs (FET 1 to FET n), n−1 capacitors, and n resistances. Here, the n FETs have the same characteristics. A source terminal (S) of the first FET (FET 1) is grounded, and a drain terminal (D) thereof is connected to a source terminal (S) of the second FET (FET 2). A source terminal of the m-th FET (FET m) is connected to a drain terminal of the (m−1)-th FET (FET m−1), where m is a positive integer between 2 and n. A source terminal of the n-th FET (FET n) is connected to a drain terminal of the (n−1)-th FET (FET n−1), and a drain terminal of the n-th FET is connected to an alternating current power supply. A source terminal 222 of the first FET, a drain terminal 224 of the n-th FET and a gate terminal (G) 226 of the first FET serve as a source terminal, a drain terminal, and a gate terminal of the cascode circuit 200, respectively. One end of the (m−1)-th capacitor (capacitance value: Cm−1) is connected to the source terminal of the first FET (that is, one end of the (m−1)-th capacitor is grounded) and the other end thereof is connected to the gate terminal of the m-th FET.

One end of the first resistor (resistance value: R1) is grounded, and the other end thereof is connected to the gate terminal of the second FET. One end of the k-th resistor (resistance value: Rk) is connected to a gate terminal of the (k+1)-th FET (FET k+1), and the other end thereof is connected to the gate terminal of the k-th FET, where k is a positive integer between 2 and n−1. One end of the n-th resistance (resistance value: Rn) is connected to the drain terminal of the n-th FET and the other end thereof is connected to the gate terminal of the n-th FET.

Figure 17:
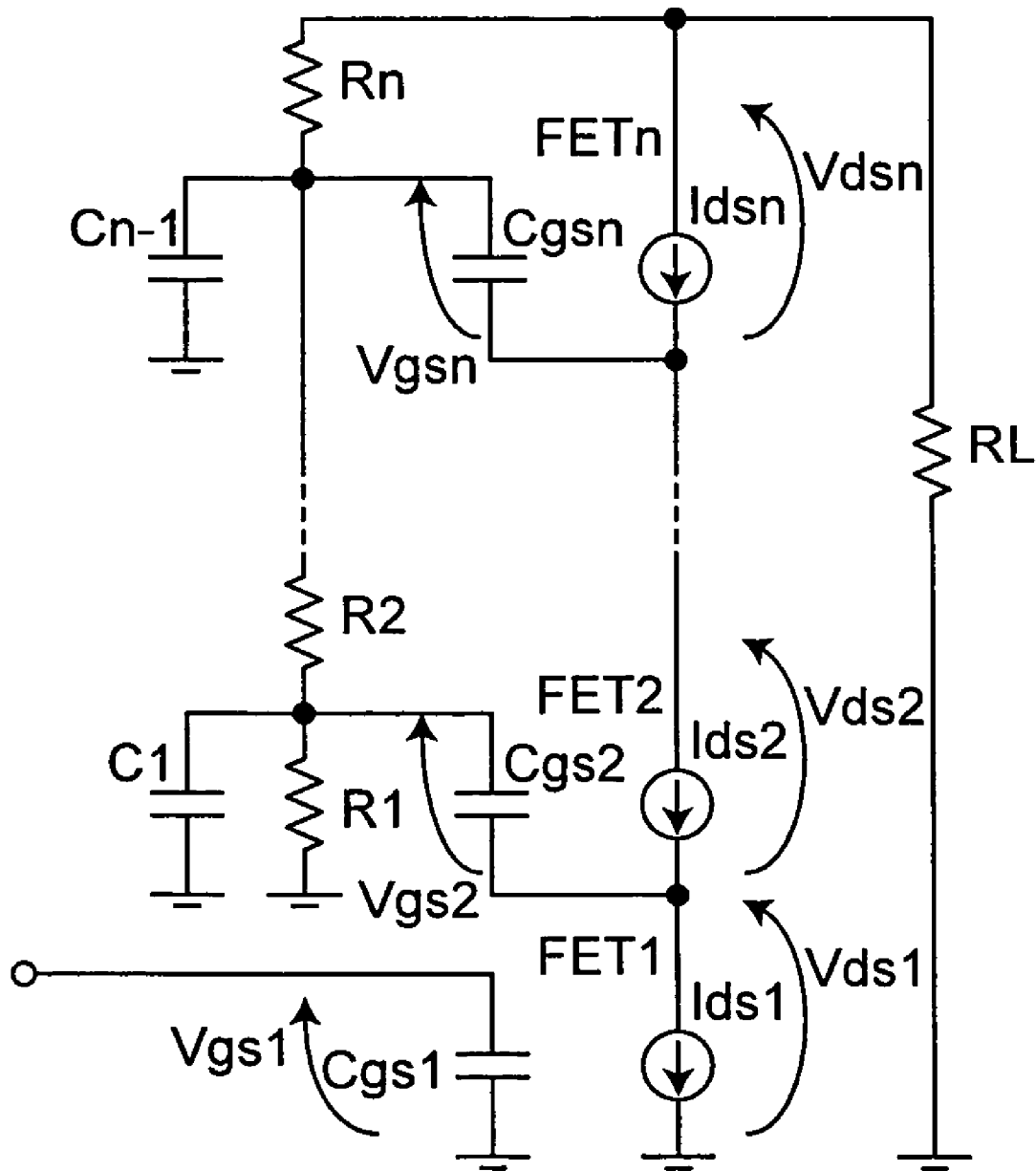
FIG. 17 is a diagram of equivalent circuit of the cascode circuit shown in FIG. 16.

FIG. 17 is an equivalent circuit of the cascode circuit shown in FIG. 16. In FIG. 17, a value of voltage between the drain and source terminals of the q-th FET (FET q) and a value of drain current thereof are indicated as Vdsq and Idsq, respectively, where q is a positive integer between 1 and n. Further, a capacitance value between the gate and source terminals of the q-th FET and a value voltage between the gate and source terminals thereof are indicated as Cgsq and Vgsq, respectively.

First, each capacitor will be explained. An optimal value of the capacitance value Cm−1 is obtained in reference to the equivalent circuit shown in FIG. 17. Referring to FIG. 17, Eqs. (9) to (11) are hold. Here, it is assumed that the capacitance value between the gate and source terminals of each of the FETs is the same (that is, Cgsq=Cgs is hold).

$$C1(\delta Vds1 + \delta Vgs2) + Cgs2 \times \delta Vgs2 = 0, \quad (9)$$

$$C2(\delta Vds1 + \delta Vds2 + \delta Vgs3) + Cgs3 \times \delta Vgs3 = 0, \quad (10)$$

$$Cj\left(\sum_{i=1}^{j} \delta Vdsi + \delta Vgs_{j+1}\right) \times Cgs \times \delta Vgs_{j+1} = 0, \quad (11)$$

where Rj>>1/ωCgs.

When all of the FETs operate equally, the current flowing through each FET is the same, and the amplitude of output voltage of each FET is the same. Thus, Eqs. (12) and (13) are hold.

$$\delta Vgsi = \delta Vgs, \quad (12)$$

$$\delta Vdsi = -1/n \times g_m RL \delta Vgs, \quad (13)$$

where gm indicates a value of mutual conductance, and RL indicates a value of load resistance.

Further, Eq. (14) is hold by using Eqs. (12) and (13).

$$Cj = \frac{Cgs}{jg_m RL/n - 1}. \quad (14)$$

By using Eq. (14), a relation of C1>C2>C3>C4> . . . >Cn−1 is obtained. If gm=48 mS, Cgs=3 pF, and RL/n=89 Ω, which are general conditions used in a high frequency application, are assigned to Eq. (14), C1=0.9 pF, C2=0.4 pF, C3=0.25 pF and C4=0.19 pF are hold.

According to a harmonic balance simulation, if capacitance values of the n−1 capacitors are close to one another, amplitudes of the voltages which the FETs output are equal to one another, so that the cascode circuit outputs high power and operates with high efficiency. Thus, if the capacitance values of the n−1 capacitors are set under the condition of C1>C2>C3>C4 . . . >Cn−1, the cascode circuit 200 outputs high power and operates with high efficiency. That is, in order to obtain a cascode circuit which outputs high power and operates with high efficiency, it is necessary that the capacitance value of C1 is in a range of 0.01 to 10 times capacitance value of Cgs, and the relation of C1>C2> . . . >Cj> . . . >Cn−1 is hold.

The cascode circuit of this embodiment can output high power and operate with high efficiency by optimizing the C1 to Cn−1.

Also in the case where the resistors are removed in the cascode circuit of this embodiment, as described in the first embodiment, the cascode circuit can output high power and operate with high efficiency by optimizing the Cm−1.

Next, it is described that what condition should be met by a resistance value (Rq) of each resistor such that the cascode circuit 200 outputs high power. It is preferable that each resistance value (Rq) is set such that the amplitude of voltage between the drain and source terminals of each FET (FETq) is maximum, that is, such that the voltage (Vdsq) between the drain and source terminals of each FET is the same. If the average value of the alternating current power supply voltage is defined as Vdd, the voltage between the drain and source terminals of each FET is Vdd/n. Further, a voltage between the gate and source terminals of each FET is the same, and the drain current of each FET is also the same. Referring to FIG. 17, Eq (15) is hold.

$$Vgs1 + k\frac{Vdd}{n} = Vdd\frac{(R1 + R2 + \ldots + Rk)}{\sum_{j=1}^{n} Rj}, \quad (15)$$

where Vgsq=Vgs1.

If the resistors have resistance values as given by Eqs. (16) to (18) derived from Eq. (15), the voltages between the drain and the source terminals of all FETs become Vdd/n, and equal to one another.

$$R1 = (Vgs1/Vdd + 1/n)\sum_{j=1}^{n} Rj = Rk(1 + nVgs1/Vdd) \quad (16)$$

$$Rk = \sum_{j=1}^{n} Rj/n \quad (2 \le k \le n-1) \quad (17)$$

$$Rn = (-Vgs1/Vdd + 1/n)\sum_{j=1}^{n} Rj = Rk(1 - nVgs1/Vdd) \quad (18)$$

Therefore, if the resistors have resistance values as given by Eqs. (16) to (18), the output power of the cascode circuit 200 is maximum.

As the same as the cascode circuit of the second embodiment, where p is a positive integer between 1 and n−1, if the resistance value (Rpo) of p-th resistor per unit gate width (1 mm) of (p+1)-th FET is higher than 0.4 kΩ and lower than 120 kΩ, the high frequency performance of the cascode circuit 40 is not deteriorated, and the affect of the gate leakage current can be ignored.

According to the cascode circuit of this embodiment, in which n FETs are cascode-connected successively, a withstand voltage between the source and drain terminals of the cascode circuit becomes about n times that between the source and drain terminals of a single FET. Thus, it becomes unnecessary to convert the power supply voltage to reduce it, and a conversion loss caused by converting the power supply voltage can be reduced.

In the cascode circuit of this embodiment, a voltage to be applied to the gate terminal of each FET is determined by using the resistors, which divide a voltage between the drain terminal of the n-th FET and the ground. Thus, unlike the case in which the voltage is applied to the gate terminal by using a gate setting terminal, there is a merit that, even if Vdd=0 V, forward current does not flow through the gate terminal, so that it is possible to prevent each FET from being destroyed.

In the cascode circuit of this embodiment, one end of the first resistor (resistance value: R1) is grounded, but it may be connected to the gate terminal of the first FET (FET 1). In that case, it is preferable that the resistance values (R1 to Rn) of the resistors are set such that the amplitude of the voltage between the drain and source terminals of each FET (FET 1 to FET n) becomes maximum, that is, such that the voltages (Vds1 to Vdsn) between the drain and the source terminals of the FETs (FET 1 to FET n) become equal to one another. Where p is a positive integer between 1 and n−1, if the p-th resistance value (Rpo) per unit gate width (1 mm) of the (p+1)-th FET is higher than 0.4 kΩ and smaller than 120 kΩ, the high frequency performance of the cascode circuit is not deteriorated, and the affect of the gate leakage current can be ignored.

Figure 18:
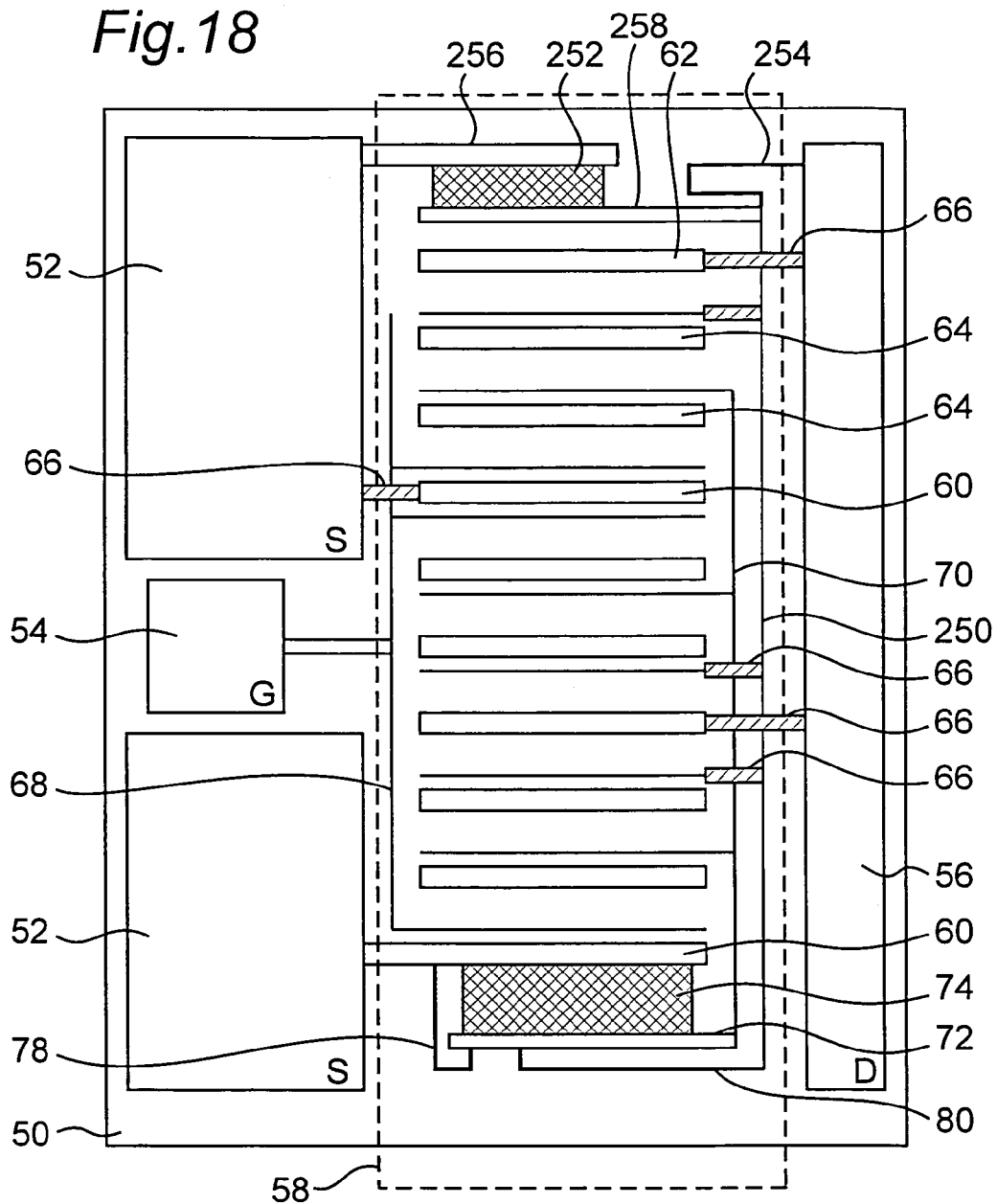
FIG. 18 is a diagram of an electrode pattern of the integrated circuit having the cascode circuit shown in FIG. 16.

Next, the integrated circuit of the cascode circuit of this embodiment will be explained. FIG. 18 is a top view of the integrated circuit having the cascode circuit in which three FETs are cascode-connected. FIG. 18 shows an electrode pattern in which three cascode circuit are connected in parallel on the substrate 50. The electrode pattern includes the two source electrode regions 52, the gate electrode region 54, the drain electrode region 56, and the cascode connecting region 58. In FIG. 18, the two source electrode regions 52 and the gate electrode region 54 are disposed on the left end of the surface of the substrate 50, and the drain electrode region 56 is disposed on the right end of the surface of the substrate 50. The cascode connecting region 58 is disposed in the central portion of the surface of the substrate 50 such that it is surrounded by the electrode regions 52, 54 and 56.

Unlike the electrode pattern shown in FIG. 6, the electrode pattern shown in FIG. 18 has two floating electrodes 64, which are disposed between the source electrode 60 of each cascode FET and the drain electrode 62 thereof as a connector between the first and second FETs and a connnector between the second and third FETs. Further, the electrode pattern shown in FIG. 18 includes a gate electrode (hereinafter, "third gate electrode") 250, an MIM capacitor 252 as the second capacitor (capacitance value: C2), and a wire resistor 254 as a third resistance, in addition to the electrode pattern shown in FIG. 6.

The third gate electrode 250 includes a straight portion extending along the drain electrode region 56 between the drain electrode region 56 and the second gate electrode 70. Branched portions of the first gate electrode 68, those of the second gate electrode 70 and those of the third gate electrode 252 are provided close to the source electrode 60 having lower potential than the drain electrode 62. In the electrode pattern shown in FIG. 18, the FET region includes a plurality of FET cells, the first gate electrode 68, the second gate electrode 70, and the third gate electrode 250.

The MIM capacitor 252 and the third wire resistor 254 are provided on the upper side of the FET region, while the MIM capacitor 73, the first wire resistor 78 and the second wire resistor 80 are provided on the lower side thereof. The MIM capacitor 252 is disposed between an electrode 256 connected to the source electrode region 52, and an electrode 258 connected to the third gate electrode 250, and the MIM capacitor 252 is connected to these electrodes.

The wire resistor 80, corresponding to the second resistor, is connected between the electrode 72, which is connected to the second gate electrode 70, and the third gate electrode 250. The third wire resistor 254 is connected between the electrode 258 connected to the third gate electrode 250 and the drain electrode region 56.

In the electrode pattern shown in FIG. 18, the wire resistors 78, 80 and 254, and the capacitors 74 and 252 are disposed adjacent to the FET region. Thus, the distance between each of the wire resistors 78, 80 and 254 and each of the FETs of the FET region, and the distance between each of the capacitors 74 and 252 and each of the FETs of the FET region are shortened compared to the case of the conventional integrated circuit. Thus, lengths of wires to connect the components to one another can be reduced, so that parasitic inductance caused by long lengths of the wires can be ignored. As a result, the cascode circuit can be operated at sufficiently high frequency.

The electrode pattern shown in FIG. 18 is just an example, the cascode circuit of this embodiment can also be realized by using the other electrode patterns. As shown in FIGS. 10 and 11, each of one or more MIM capacitors 74 may provided opposed to one of source electrode regions 52. Alternatively, as shown in FIG. 12, the MIM capacitor 74 may be provided opposed to the drain electrode region 56. Further, as shown in FIG. 13, each of the drain electrodes 62 and the drain electrode region 56 may be connected to each other by using a wide air bridge. The MIM capacitors 74 of each of the cell assemblies may be connected to the source electrode region of the adjacent cell assembly. In any cases, the same effect as described in the second embodiment can be obtained.

As explained in the second embodiment, the floating electrodes 64 may be omitted. The gate length of the second FET and the gate length of the third FET may be set shorter than the gate length of the first FET. In such a case, the same effect as described in the second embodiment can be obtained.

5th Embodiment

Figure 19:
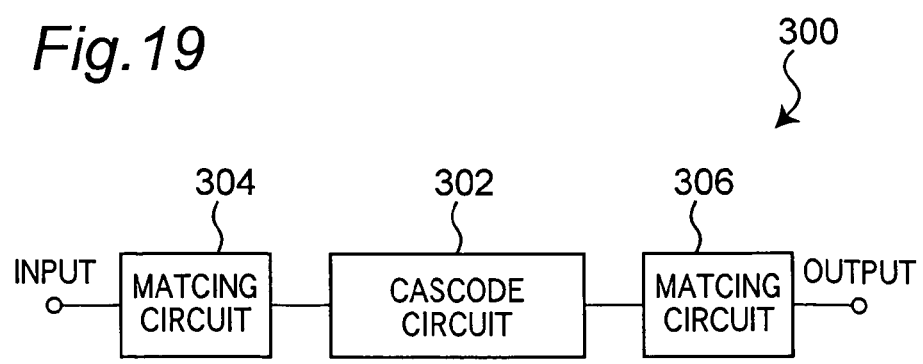
FIG. 19 is a block diagram of a high frequency amplifier circuit with the cascode circuit according to this present invention.

FIG. 19 is a block diagram of a high frequency amplifier circuit with the cascode circuit according to any of the first to fourth embodiments. As shown in FIG. 19, the high frequency amplifier circuit 300 includes a cascode circuit 302, an input side matching circuit 304, and an output side matching circuit 306. The input side matching circuit 304 matches the input impedance of the cascode circuit 302. The output side matching circuit 306 matches the output impedance of the cascode circuit 302. For example, when the amplifier circuit 300 is used in a cellular phone, the output side matching circuit 306 allows the output impedance of the cascode circuit 302 and the input impedance of antenna to coincide with each other at 50 Ω.

The high frequency amplifier circuit of this embodiment can operate at high voltage, because it uses the cascode circuit according to any one of the first to fourth embodiments. Further, the high frequency amplifier circuit can reduce power supply current capacity, so that it can be reduced in size and cost.

It will be obvious to those having skill in the art that many changes may be made in the above-described details of the preferred embodiments of the present invention. The scope of the present invention, therefore, should be determined by the following claims.

What is claimed is:

1. A cascode circuit comprising:
    a first field effect transistor which has a source terminal grounded;
    a second field effect transistor which has a source terminal connected to a drain terminal of said first field effect transistor; and
    a first capacitor connected between the source terminal of said first field effect transistor and a gate terminal of said second field effect transistor,
    wherein said first field effect transistor and said second field effect transistor are cascode-connected successively; and
    a capacitance value of said first capacitor is 0.01 to 10 times that between the gate and source terminals of said second field effect transistor.

2. The cascode circuit according to claim 1, further comprising:
    a first resistor connected between the source terminal of said first field effect transistor and the gate terminal of said second field effect transistor; and
    a second resistor connected between the gate terminal of said second field effect transistor and a drain terminal of said second field effect transistor.

3. The cascode circuit according to claim 2, wherein a resistance value of said first resistor-per a gate width of 1 mm of said second field effect transistor is larger than 0.1 kΩ and smaller than 120 kΩ.

4. A cascode circuit comprising:
    n field effect transistors, where n is a positive integer equal to or larger than three, wherein said n field effect transistors include:
        a first field effect transistor having a source terminal grounded; and
        n−1 field effect transistors, wherein an m-th field effect transistor having a source terminal connected to a drain terminal of an (m−1)-th field effect transistor, where m is a positive integer between 2 and n;
        said n field effect transistors being cascode-connected successively; and
    n−1 capacitors, wherein an (m−1)-th capacitor connected between the source terminal of said first field effect transistor and a gate terminal of said m-th field effect transistor; and
    a capacitance value of said first capacitor is 0.01 to 10 times that between the gate and source terminals of said second field effect transistor.

5. The cascode circuit according to claim 4, further comprising n resistors which include:
    a first resistor connected between the source terminal of said first field effect transistor and the gate terminal of said second field effect transistor;
    n−2 resistors, wherein a k-th resistor connected between a gate terminal of said k-th field effect transistor and a gate terminal of said (k+1)-th field effect transistor, where k is a positive integer between 2 and n−1; and
    an n-th resistor connected to the gate terminal of said n-th field effect transistor and a drain terminal of said n-th field effect transistor.

6. The cascode circuit according to claim 5, wherein a resistance value of said p-th resistor per a gate width of 1 mm of said (p+1)-th field effect transistor is larger than 0.1 kΩ and smaller than 120 kΩ, where p is a positive integer between 1 and n−1.

7. The cascode circuit according to claim 4, wherein a capacitance value of said k-th capacitor is smaller than that of said (k−1)-th capacitor, where k is a positive integer between 2 and n−1.

8. The cascode circuit according to claim 7, wherein said n field effect transistors have the same capacitance values between the gate and source terminals thereof and the same mutual conductance values, and
    said p-th capacitor has a capacitance value of $Cgs/\{(pg_mRL/n)-1\}$, where Cgs is a capacitance value between the gate and source terminals of each of said n field effect transistors, $g_m$ is a mutual conductance value of each of said n field effect transistors, RL is a value of a load resistance of said cascode circuit, and p is a positive integer between 1 and n−1.

9. The cascode circuit according to claim 2, wherein the resistance values of said first and second resistors are set such that a voltage between the drain and source terminals of said first field effect transistor is equal to that between the drain and source terminals of said second field effect transistor.

10. The cascode circuit according to claim 5, wherein the resistance values of said n resistors are set such that voltages between the drain and the source terminals of said n field effect transistors become equal to one another.

11. The cascode circuit according to claim 1, further comprising:
- a first resistor connected between a gate terminal of said first field effect transistor and the gate terminal of said second field effect transistor; and
- a second resistor connected between the gate terminal of said second field effect transistor and a drain terminal of said second field effect transistor.

12. The cascode circuit according to claim 4, further comprising n resistors which include:
- a first resistor connected between a gate terminal of said first field effect transistor and the gate terminal of said second field effect transistor;
- n−2 resistors, wherein k-th resistor connected between a gate terminal of said k-th field effect transistor and a gate terminal of said (k+1)-th field effect transistor, where k is a positive integer between 2 and n−1; and
- an n-th resistor connected to the gate terminal of said n-th field effect transistor and a drain terminal of said n-th field effect transistor.

13. An integrated circuit comprising at least one cascode circuit, wherein each of said at least one cascode circuit includes:
- a first field effect transistor which has a source terminal grounded;
- a second field effect transistor which has a source terminal connected to a drain terminal of said first field effect transistor; and
- a first capacitor connected between the source terminal of said first field effect transistor and a gate terminal of said second field effect transistor;
- said first field effect transistor and said second field effect transistor are cascode-connected successively; and
- a capacitance value of said first capacitor is 0.01 to 10 times that between the gate and source terminals of said second field effect transistor;
- wherein said integrated circuit includes:
  - at least one source electrode region capable of being connected to the outside of said integrated circuit;
  - at least one drain electrode region capable of being connected to the outside of said integrated circuit;
  - a field effect transistor region which includes a source electrode of said first field effect transistor of each of said at least one cascode circuit, a gate electrode of said first field effect transistor thereof, a gate electrode of said second field effect transistor thereof, and a drain electrode of said second field effect transistor thereof; and
  - a single capacitor region which corresponds to said first capacitor of each of said at least one cascode circuit;
- wherein said at least one source electrode region, said at least one drain electrode region, said field effect transistor region, and said single capacitor region are provided on a semiconductor substrate;
- each of at least one source electrode of said field effect transistor region and each of at least one drain electrode thereof are electrically connected to said at least one source electrode region and said at least one drain electrode region, respectively; and
- said single capacitor region is disposed in the vicinity of said field effect transistor region.

14. The integrated circuit according to claim 13, wherein each of said at least one cascode circuit further comprises:
- a first resistor connected between the source terminal of said first field effect transistor and the gate terminal of said second field effect transistor; and
- a second resistor connected between the gate terminal of said second field effect transistor and a drain terminal of said second field effect transistor;
- said integrated circuit further comprises:
  - two resistor regions which correspond to said first resistor of each of said at least one cascode circuit and said second resistor of each of them, said two resistor regions being provided on the semiconductor substrate; and said two resistor regions being disposed in the vicinity of said field effect transistor region.

15. An integrated circuit comprising at least one cascode circuit, wherein each of said at least one cascode circuit includes:
- n field effect transistors, where n is a positive integer equal to or larger than three, wherein said n field effect transistors include:
  - a first field effect transistor having a source terminal grounded; and
  - n−1 field effect transistors, wherein an m-th field effect transistor having a source terminal connected to a drain terminal of an (m−1)-th field effect transistor, where m is a positive integer between 2 and n;
- said n field effect transistors being cascode-connected successively; and
- n−1 capacitors, wherein an (m−1)-th capacitor connected between the source terminal of said first field effect transistor and a gate terminal of said m-th field effect transistor; and
- a capacitance value of said first capacitor is 0.01 to 10 times that between the gate and source terminals of said second field effect transistor;
- wherein said integrated circuit includes:
  - at least one source electrode region capable of being connected to the outside of said integrated circuit;
  - at least one drain electrode region capable of being connected to the outside of said integrated circuit;
  - a field effect transistor region which includes a source electrode of said first field effect transistor of each of said at least one cascode circuit, a gate electrode of said q-th field effect transistor thereof, and a drain electrode of said n-th field effect transistor thereof, where q is a positive integer between 1 and n; and
  - n−1 capacitor regions which correspond to said n−1 capacitors of each of said at least one cascode circuit;
- said at least one source electrode region, said at least one drain electrode region, said field effect transistor region, and said n−1 capacitor regions are provided on a semiconductor substrate;
- each of at least one source electrode and each of at least one drain electrode of said field effect transistor region are electrically connected to said at least one source electrode region and said at least one drain electrode region, respectively; and
- said n−1 capacitor regions are disposed in the vicinity of said field effect transistor region.

16. The integrated circuit according to claim 15, wherein each of said at least one cascode circuit further comprise:
- n resistors which include:
  - a first resistor connected to the source terminal of said first field effect transistor and the gate terminal of said second field effect transistor;
  - n−2 resistors, wherein a k-th resistor connected between a gate terminal of said k-th field effect transistor and a gate terminal of said. (k+1)-th field effect transistor, where k is a positive integer between 2 and n−1; and an n-th resistor connected to a gate terminal of said n-th field effect transistor and a drain terminal of said n-th field effect transistor;

wherein said integrated circuit further includes n resistor regions which correspond to said n resistors of each of said at least one cascode circuit, said n resistor regions being provided on the semiconductor substrate, and said n resistor regions being disposed in the vicinity of said field effect transistor region.

17. The integrated circuit according to claim 13, wherein said field effect transistor region is disposed between said at least one source electrode region and said at least one drain electrode region; and said single capacitor region is disposed adjacent to at least one source electrode of said field effect transistor region.

18. The integrated circuit according to claim 15, wherein said field effect transistor region is disposed between said at least one source electrode region and said at least one drain electrode region; and at least one of said n−1 capacitor regions are disposed adjacent to at least one source electrode of said field effect transistor region.

19. The integrated circuit according to claim 13, wherein each of at least one source electrode of said field effect transistor region and each of at least one drain electrode thereof are arranged alternately;

at least one of said at least one source electrode is disposed between said single capacitor region and either said at least one source electrode region or said at least one drain electrode region; and a direction in which each of said at least one source electrode of said field effect transistor region and each of said at least one drain electrode thereof are arranged alternately is perpendicular to a direction in which said single capacitor region and either said at least one source electrode region or said at least one drain electrode region are opposed to each other.

20. The integrated circuit according to claim 15, wherein each of at least one source electrode of said field effect transistor region and each of at least one drain electrode thereof are arranged alternately;

at least one of said at least one source electrode is disposed between each of said n−1 capacitor regions and either said at least one source electrode region or said at least one drain electrode region; and a direction in which each of said at least one source electrode of said field effect transistor region and each of said at least one drain electrode thereof are arranged alternately is perpendicular to a direction in which each of said n−1 capacitor regions and either said at least one source electrode region or said at least one drain electrode region are opposed to each other.

21. The integrated circuit according to claim 13, wherein said single capacitor region comprises a plurality of partial capacitor regions, said plurality of partial capacitor regions are disposed in the vicinity of said field effect transistor region.

22. The integrated circuit according to claim 15, wherein each of said n−1 capacitor regions comprises a plurality of partial capacitor regions, said plurality of partial capacitor regions are disposed in the vicinity of said field effect transistor region.

23. The integrated circuit according to claim 21, wherein each of at least one source electrode of said field effect transistor region and each of at least one drain electrode thereof are arranged alternately;

at least one of said at least one source electrode is disposed between each of said plurality of partial capacitor regions and either said at least one source electrode region or said at least one drain electrode region; and a direction in which each of said at least one source electrode of said field effect transistor region and each of said at least one drain electrode thereof are arranged alternately is perpendicular to a direction in which each of said plurality of partial capacitor regions and either said at least one source electrode region or said at least one drain electrode region are opposed to each other.

24. The integrated circuit according to claim 22, wherein each of at least one source electrode of said field effect transistor region and each of at least one drain electrode thereof are arranged alternately;

at least one of said at least one source electrode is disposed between each of said plurality of partial capacitor regions and either said at least one source electrode region or said at least one drain electrode region; and a direction in which each of said at least one source electrode of said field effect transistor region and each of said at least one drain electrode thereof are arranged alternately is perpendicular to a direction in which each of said plurality of partial capacitor regions and either said at least one source electrode region or said at least one drain electrode region are opposed to each other.

25. The integrated circuit according to claim 13, wherein at least one source electrode and at least one drain electrode of said field effect transistor region are rectangular electrodes;

each of said at least one source electrode and each of said at least one drain electrode are arranged alternately in a direction perpendicular to a longer side of the rectangular shape;

a direction in which each of said at least one source electrode and each of said at least one drain electrode are arranged alternately is in parallel to a direction in which said field effect transistor region and said at least one drain electrode region are opposed to each other;

said at least one drain electrode of said field effect transistor region is connected to said at least drain electrode region by an air bridge.

26. The integrated circuit according to claim 15, at least one source electrode and at least one drain electrode of said field effect transistor region are rectangular electrodes;

each of said at least one source electrode and each of said at least one drain electrode are arranged alternately in a direction perpendicular to a longer side of the rectangular shape;

a direction in which each of said at least one source electrode and each of said at least one drain electrode are arranged alternately is in parallel to a direction in which said field effect transistor region and said at least one drain electrode region are opposed to each other;

said at least one drain electrode of said field effect transistor region is connected to said at least drain electrode region by an air bridge.

27. The integrated circuit having a plurality of cascode circuits, wherein each of said plurality of cascode circuit comprises:

a first field effect transistor which has a source terminal grounded;
a second field effect transistor which has a source terminal connected to a drain terminal of said first field effect transistor; and
a first capacitor connected between the source terminal of said first field effect transistor and a gate terminal of said second field effect transistor; wherein said first field effect transistor and said second field effect transistor are cascode-connected successively; and
a capacitance value of said first capacitor is 0.01 to 10 times that between the gate and source terminals of said second field effect transistor;
said integrated circuit comprises:
   a plurality of source electrode regions capable of being connected to the outside of said integrated circuit;
   a plurality of drain electrode regions capable of being connected to the outside of said integrated circuit;
   a plurality of field effect transistor regions each of which includes source and gate electrodes of said first field effect transistor of at least one of said plurality of cascode circuits, and gate and drain electrodes of said second field effect transistor of at least one of them; and
   a plurality of capacitor regions each of which corresponds to said first capacitor of each of said plurality of cascode circuits;
said plurality of source regions, said plurality of drain regions, said plurality of field effect transistor regions, and said plurality of capacitor regions are provided on a semiconductor substrate;
said integrated circuit comprising a plurality of cell assemblies each of which includes one of said plurality of source electrode regions, one of said plurality of drain electrode regions, one of said plurality of field effect transistor regions, and one of said plurality of capacitor regions;
said capacitor region and said source electrode region are opposed to each other in each of said plurality of cell assemblies;
said field effect transistor region is arranged between said capacitor region and said source electrode region in each of said plurality of cell assemblies;
a direction in which said drain electrode region and said field effect transistor region are opposed to each other is perpendicular to that in which said capacitor region and said source electrode region are opposed to each other in each of said plurality of cell assemblies; and
said capacitor region of each of said a plurality of cell assemblies is connected to said source electrode region of an adjacent cell assembly.

28. The integrated circuit according to claim 13, wherein each of said at least one source electrode of said field effect transistor region and each of said at least one drain electrode thereof are alternately arranged; and
   an ion implantation region is provided between each of said at least one source electrode and each of said at least one drain electrode, as a connector which connects said first field effect transistor and second field effect transistor of each of said at least one cascode circuit successively.

29. The integrated circuit according to claim 15, wherein each of said at least one source electrode of said field effect transistor region and each of said at least one drain electrodes thereof are alternately arranged; and
   n−1 ion implantation regions are provided between each of said at least one source electrode and said at least one drain electrode, as connectors which connect said n field effect transistors of each of said at least one cascode circuit with one other.

30. The integrated circuit according to claim 27, wherein each of at least one source electrode and each of at least one drain electrode of said field effect transistor region of each of said cell assemblies are alternately arranged; and
   an ion implantation region is provided between each of said at least one source electrode and each of said at least one drain electrode, as a connector which connects said first field effect transistor and second field effect transistor of each of said at least one cascode circuit successively.

31. The integrated circuit according to claim 13, wherein a part of said gate electrode of said first field effect transistor and a part of said gate electrode of said second field effect transistor are provided between each of at least one source electrode of said field effect transistor region and each of at least one drain electrode thereof; and
   the part of said gate electrode of said first field effect transistor and the part of said gate electrode of said second field effect transistor are disposed closer to said each of at least one source electrode than said each of at least one drain electrode.

32. The integrated circuit according to claim 27, wherein a part of said gate electrode of said first field effect transistor and a part of said gate electrode of said second field effect transistor are provided between each of at least one source electrode of each of said plurality of field effect transistor regions and each of at least one drain electrode thereof; and
   the part of said gate electrode of said first field effect transistor and the part of said gate electrode of said second field effect transistor are disposed closer to said each of at least one source electrode than said each of at least one drain electrode.

33. The integrated circuit according to claim 15, wherein a part of said gate electrode of said q-th field effect transistor is provided between each of at least one source electrode of said field effect transistor region and each of at least one drain electrode thereof, where q is a positive integer between 1 and n; and
   the part of said gate electrode of said q-th field effect transistor is disposed closer to said each of at least one source electrode than said at least one drain electrode.

34. The integrated circuit according to claim 13, wherein each of said at least one source electrode of said field effect transistor region and each of said at least one drain electrode thereof are alternately arranged;
   a part of said gate electrode of said first field effect transistor and a part of said gate electrode of said second field effect transistor are provided between each of at least one source electrode of said field effect transistor region and each of at least one drain electrode thereof; and
   a length of the part of said gate electrode of said first field effect transistor is longer than that of the part of said gate electrode of said second field effect transistor in the direction which is parallel to a direction in which each of said at least one source electrode and each of said at least one drain electrode are alternately arranged.

35. The integrated circuit according to claim 27, wherein each of at least one source electrode and each of at least one drain electrode of said field effect transistor region of each of said cell assemblies are alternately arranged;
   a part of said gate electrode of said first field effect transistor and a part of said gate electrode of said second field effect transistor are provided between each of at least one source electrode of each of said plurality of field effect transistor regions and each of at least one drain electrode thereof; and a length of the part of said gate electrode of said first field effect transistor is longer than that of the part of said gate electrode of said second field effect transistor in the direction which is parallel to a direction in which each of said at least one source electrode and each of said at least one drain electrode are alternately arranged.

36. The integrated circuit according to claim 15, wherein each of said at least one source electrode of said field effect transistor region and each of said at least one drain electrodes thereof are alternately arranged;

a part of said gate electrode of said q-th field effect transistor is provided between each of at least one source electrode of said field effect transistor region and each of at least one drain electrode thereof, where q is a positive integer between 1 and n; and a length of the part of said gate electrode of said first field effect transistor is longer than lengths of the parts of said gate electrodes of the field effect transistors other than said first field effect transistor in the direction which is parallel to a direction in which each of said at least one source electrode and each of said at least one drain electrode are alternately arranged.

* * * * *